US009214198B2

(12) United States Patent
Ellis et al.

(10) Patent No.: US 9,214,198 B2
(45) Date of Patent: Dec. 15, 2015

(54) CONTINUOUS CAPACITOR HEALTH MONITORING AND POWER SUPPLY SYSTEM

(71) Applicant: SanDisk Enterprise IP LLC, Milpitas, CA (US)

(72) Inventors: Robert W. Ellis, Phoenix, AZ (US); Gregg S. Lucas, Tuscon, AZ (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 0 days.

(21) Appl. No.: 14/599,128

(22) Filed: Jan. 16, 2015

(65) Prior Publication Data

US 2015/0318027 A1 Nov. 5, 2015

Related U.S. Application Data

(60) Provisional application No. 61/986,808, filed on Apr. 30, 2014.

(51) Int. Cl.
  *G01R 17/16* (2006.01)
  *G11C 5/14* (2006.01)
  (Continued)

(52) U.S. Cl.
  CPC .............. *G11C 5/148* (2013.01); *G01R 17/105* (2013.01); *G01R 17/16* (2013.01);
  (Continued)

(58) Field of Classification Search
  CPC ...... G11C 5/141; G11C 5/143; G01R 17/105; G01R 17/16
  USPC ........... 365/226, 228, 229; 323/367; 324/416, 324/500, 521, 522, 526, 527, 548; 307/64
  See application file for complete search history.

(56) References Cited

U.S. PATENT DOCUMENTS 4,322,766 A * 3/1982 Becker ..................... H02H 7/16
  340/635
4,528,458 A * 7/1985 Nelson ..................... H02J 1/10
  307/44

(Continued)

FOREIGN PATENT DOCUMENTS

EP 1 956 489 A2 8/2008

OTHER PUBLICATIONS

IBM Corporation, "Systems Management, Work Management," Version 5, Release 4, 9th Edition, Feb. 2006, pp. 1-21.

(Continued)

*Primary Examiner* — Hoai V Ho
*Assistant Examiner* — Jay Radke
(74) *Attorney, Agent, or Firm* — Morgan, Lewis & Bockius LLP

(57) ABSTRACT

An electronic device includes a subsystem, a plurality of energy storage elements coupled to the subsystem through one or more switches, and a charging and monitoring apparatus for concurrently charging the plurality of energy storage elements and monitoring operability of the energy storage elements. A first subset of the energy storage elements is coupled to a first node and a second subset of the energy storage elements is coupled to a second node of a bridge circuit. A power supply provides a DC charging voltage and an AC test voltage to both the first and second subsets of the energy storage elements. A monitoring circuit produces a predefined fault signal if a predefined electrical characteristic of the first subset of the energy storage elements differs from a same predefined electrical characteristic of the second subset of the energy storage elements by more than a predefined amount.

24 Claims, 13 Drawing Sheets

(51) Int. Cl.
  *G01R 31/26* (2014.01)
  *G01R 31/28* (2006.01)
  *G11C 29/02* (2006.01)
  *G01R 17/10* (2006.01)

(52) U.S. Cl.
  CPC ....... *G01R 31/2607* (2013.01); *G01R 31/2832* (2013.01); *G11C 5/141* (2013.01); *G11C 5/143* (2013.01); *G11C 29/021* (2013.01)

(56) References Cited

U.S. PATENT DOCUMENTS

| | | |
|---|---|---|
| 4,600,962 A | 7/1986 | Bliehall |
| 5,193,176 A | 3/1993 | Brandin |
| 5,568,429 A | 10/1996 | D'Souza et al. |
| 6,393,584 B1 | 5/2002 | McLaren et al. |
| 6,597,073 B1 | 7/2003 | Check |
| 6,678,788 B1 | 1/2004 | O'Connell |
| 6,738,268 B1 | 5/2004 | Sullivan et al. |
| 8,001,419 B2 | 8/2011 | Killian et al. |
| 2003/0074592 A1 | 4/2003 | Hasegawa |
| 2003/0126494 A1 | 7/2003 | Strasser |
| 2004/0252670 A1 | 12/2004 | Rong et al. |
| 2005/0114587 A1 | 5/2005 | Chou et al. |
| 2005/0134288 A1* | 6/2005 | Monter ............... H02P 21/0032 324/538 |
| 2006/0039196 A1 | 2/2006 | Gorobets et al. |
| 2006/0108875 A1* | 5/2006 | Grundmann ........... G01R 31/40 307/70 |
| 2007/0083779 A1 | 4/2007 | Misaka et al. |
| 2007/0180188 A1 | 8/2007 | Fujibayashi et al. |
| 2009/0168525 A1 | 7/2009 | Olbrich et al. |
| 2010/0008175 A1 | 1/2010 | Sweere et al. |
| 2010/0052426 A1 | 3/2010 | Carter et al. |
| 2010/0052625 A1 | 3/2010 | Cagno et al. |
| 2010/0095048 A1 | 4/2010 | Bechtolsheim et al. |
| 2010/0103737 A1 | 4/2010 | Park |
| 2011/0066872 A1 | 3/2011 | Miller et al. |
| 2011/0085657 A1 | 4/2011 | Matthews, Jr. |
| 2012/0054456 A1 | 3/2012 | Grube et al. |
| 2012/0089855 A1* | 4/2012 | Beckhoff .................. G06F 1/30 713/340 |
| 2012/0271990 A1 | 10/2012 | Chen et al. |
| 2013/0019076 A1 | 1/2013 | Amidi et al. |
| 2013/0336081 A1 | 12/2013 | Sheets et al. |
| 2014/0001861 A1 | 1/2014 | Mann et al. |
| 2014/0006798 A1 | 1/2014 | Prakash et al. |
| 2014/0008970 A1 | 1/2014 | Yamaguchi |
| 2014/0012522 A1* | 1/2014 | Colombi .............. G01R 31/028 702/58 |

OTHER PUBLICATIONS

Texas Instruments, "Power Management IC For Digital Set Top Boxed," SLVSA10A, Sep. 2009, pp. 1-22.

International Search Report and Written Opinion dated Jan. 26, 2015, received in International Patent Application No. PCT/US2014/059118, which corresponds to U.S. Appl. No. 14/135,371, 11 pages (Lucas).

International Search Report and Written Opinion dated May 27, 2015, received in International Patent Application No. PCT/US2014/067476, which corresponds to U.S. Appl. No. 14/135,417, 14 pages (Lucas).

International Search Report and Written Opinion dated Jul. 26, 2013, received in International Patent Application No. PCT/US2013/035162, which corresponds to U.S. Appl. No. 13/855,567, 7 pages (Ellis).

International Preliminary Report on Patentability dated Oct. 30, 2014, received in International Patent Application No. PCT/US2013/035162, which corresponds to U.S. Appl. No. 13/855,567, 4 pages (Ellis).

International Search Report and Written Opinion dated Jul. 14, 2015, received in International Patent Application No. PCT/US2015/027263, which corresponds to U.S. Appl. No. 14/599,128, 10 pages (Ellis).

* cited by examiner

700

---

Providing a DC charging voltage and an AC test voltage to both a first subset of the plurality of energy storage elements and a second subset of the plurality of energy storage elements, distinct from the first subset ~702

The plurality of energy storage elements are coupled to a subsystem through one or more switches ~704

The first subset of the plurality of energy storage elements is coupled to a first node of a bridge circuit ~706

The second subset of the plurality of energy storage elements is coupled to a second node of the bridge circuit, wherein the bridge circuit comprises a plurality of resistive elements, the plurality of resistive elements including a measurement resistor coupled between the first and the second node of the bridge circuit ~708

The plurality of resistive elements in the bridge circuit includes an adjustable resistive element ~710

Adjusting the adjustable resistive element in the bridge circuit until a difference between a signal on the first node of the bridge circuit and a signal on the second node of the bridge circuit is minimized or satisfies by a predefined null condition ~712

The plurality of resistive elements in the bridge circuit includes at least two adjustable resistive elements ~714

Adjusting at least one of the adjustable resistive elements in the bridge circuit until a difference between a signal on the first node of the bridge circuit and a signal on the second node of the bridge circuit is minimized or satisfies by a predefined null condition ~716

(A)

Figure 7A

CONTINUOUS CAPACITOR HEALTH MONITORING AND POWER SUPPLY SYSTEM

RELATED APPLICATIONS

This application claims priority to U.S. Provisional Patent Application No. 61/986,808, filed Apr. 30, 2014, which is hereby incorporated by reference in its entirety.

TECHNICAL FIELD

The disclosed embodiments relate generally to memory systems, and in particular, to power sequencing and data hardening circuitry architecture in memory devices.

BACKGROUND

Semiconductor memory devices, including flash memory, typically utilize memory cells to store data as an electrical value, such as an electrical charge or voltage. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Data hardening, the saving of data and mission critical metadata held in volatile storage, is an integral part of a storage device. When there is a power failure, mission critical data may reside in volatile memory in a number of sub-system components. Coordinating and managing multiple sub-system components to ensure that volatile data is saved successfully is important for safeguarding data integrity of a storage device.

For this reason, many flash memory-based data storage devices, such as Solid-state Drives (SSDs), employ an energy storage system for supplying power during a power failure operation. Energy storage elements of these critical systems, however, typically degrade over time and also face the risk of unexpected failures, impacting their ability to hold sufficient charge for a power failure operation.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to enable detection of degradations and failures of energy storage elements in memory devices. In one aspect, an electronic device includes a charging and monitoring apparatus for concurrently charging and monitoring the operability of a plurality of energy storage elements.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIGS. 7A-7E illustrate a flowchart representation of a method of concurrently charging and monitoring operability of a plurality of energy storage elements, in accordance with some embodiments.

Figure 1:
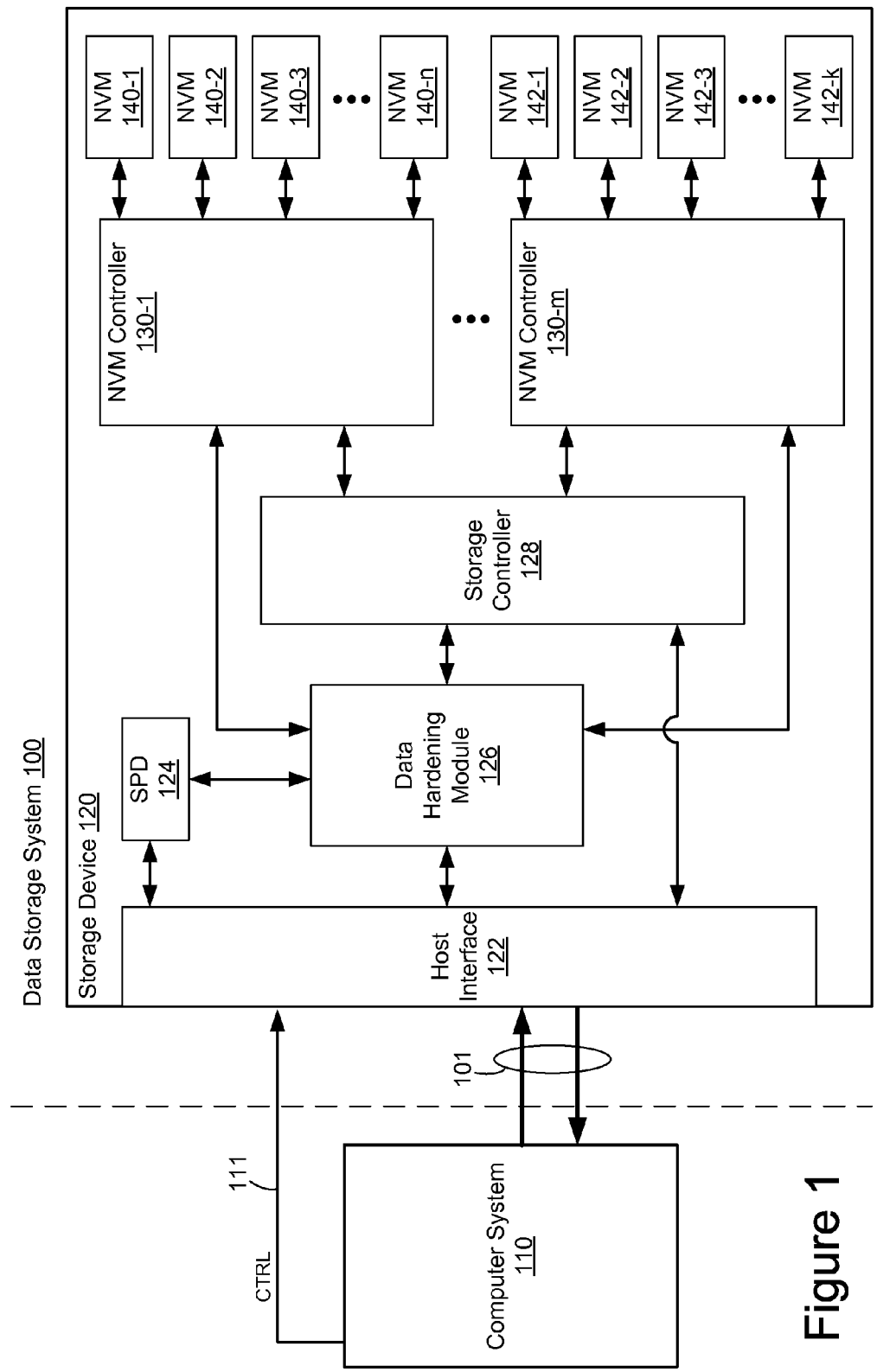
FIG. 1 is a block diagram illustrating a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used to enable concurrently charging and monitoring the operability of a plurality of energy storage elements in memory devices.

More specifically, some embodiments include an electronic device comprising (1) a subsystem, (2) a plurality of energy storage elements coupled to the subsystem through one or more switches, and (3) a charging and monitoring apparatus for concurrently charging the plurality of energy storage elements and monitoring operability of the plurality of energy storage elements. In some embodiments, the charging and monitoring apparatus includes (a) a bridge circuit comprising a plurality of resistive elements, the plurality of resistive elements including a measurement resistor coupled between a first node and a second node of the bridge circuit, wherein a first subset of the plurality of energy storage elements is coupled to the first node and a second subset of the plurality of energy storage elements, distinct from the first subset, is coupled to the second node, (b) a power supply, coupled to the first node and the second node through the bridge circuit, for providing a direct current (DC) charging voltage and an alternating current (AC) test voltage to both the first subset of the plurality of energy storage elements and the second subset of the plurality of energy storage elements, and (c) a monitoring circuit coupled to the first node and second node and configured to produce a fault indicator output signal, the fault indicator output signal comprising a predefined fault signal if a predefined electrical characteristic of the first subset of the plurality of energy storage elements differs from a same predefined electrical characteristic of the second subset of the plurality of energy storage elements by more than a predefined amount.

In some embodiments, the electronic device comprises a storage device having one or more non-volatile memory (NVM) devices.

In some embodiments, the plurality of energy storage elements comprises a plurality of capacitor banks, each capacitor bank comprising one or more capacitors.

In some embodiments, the plurality of resistive elements in the bridge circuit includes an adjustable resistive element coupled between the power supply and the first node.

In some embodiments, the power supply provides the AC test voltage in accordance with a predefined duty cycle of less than 5 percent, and the monitoring circuit produces the output signal in accordance with the predefined duty cycle.

Further, in some embodiments, the AC test voltage comprises a sequence of positive pulses only.

In some embodiments, the monitoring circuit comprises a first comparator, wherein the first comparator comprises a first input coupled to the first node, a second input coupled to the second node, and a first comparator output.

Optionally, in some embodiments, the monitoring circuit further includes a second comparator, wherein the second comparator comprises a first input coupled to the output of the first comparator, a second input coupled to a reference voltage, and an output. Further, in some embodiments, the second comparator is configured to produce the predefined fault signal on said output of the second comparator if the predefined electrical characteristic of the first subset of the plurality of energy storage elements differs from the same predefined electrical characteristic of the second subset of the plurality of energy storage elements by more than the predefined amount.

Optionally, in some embodiments, the monitoring circuit further includes an analog-to-digital converter (ADC), wherein the ADC comprises an input coupled to the first comparator output.

Optionally, in some embodiments, the monitoring circuit further includes a servo circuit coupled to the first comparator output and to at least two adjustable resistive elements in the bridge circuit, wherein the servo circuit is configured to adjust at least one of the adjustable resistive elements in the bridge circuit until the first comparator output is minimized or satisfies by a predefined null condition.

Optionally, in some embodiments, the monitoring circuit further includes a phase comparator for comparing a phase of the AC test voltage with a phase of the first comparator output, and producing a phase comparison signal corresponding to operability of the first subset of plurality of energy storage elements.

In some embodiments, the electronic device further includes a processor programmed to respond to production of the fault indicator output signal comprising the predefined fault signal by performing at least one action selected from the group consisting of: logging the fault indicator output signal; signaling a host system of an error event; and adjusting an amount of data to be stored to non-volatile memory during a power fail operation.

In some embodiments, the electronic device further includes power fail logic for enabling the one or more switches to couple the plurality of energy storage elements to the subsystem through the one or more switches, in accordance with a determination that a power fail event has occurred. Furthermore, in some embodiments, the power fail logic includes at least one comparator for comparing a voltage corresponding to an external power supply voltage with a voltage corresponding to a predefined reference voltage. Optionally, in some embodiments, the one or more switches include a first switch coupling one or more of the first subset of the plurality of energy storage elements to the subsystem and a second switch coupling one or more of the second subset of the plurality of energy storage elements to the subsystem, and the power fail logic includes logic for, in accordance with a predefined fault determination, enabling one of the first switch and second switch, and not enabling the other of the first switch and second switch.

In another aspect, a method of concurrently charging a plurality of energy storage elements and monitoring operability of the plurality of energy storage elements, wherein the plurality of energy storage elements are coupled to a subsystem through one or more switches, includes providing a DC charging voltage and an AC test voltage to both a first subset of the plurality of energy storage elements and a second subset of the plurality of energy storage elements, distinct from the first subset. The first subset of the plurality of energy storage elements is coupled to a first node of a bridge circuit, and the second subset of the plurality of energy storage elements is coupled to a second node of the bridge circuit. The bridge circuit includes a plurality of resistive elements, including a measurement resistor coupled between the first and the second node of the bridge circuit. The method includes, in response to providing the AC test voltage, producing a fault indicator output signal, which includes a predefined fault signal if a predefined electrical characteristic of the first subset of the plurality of energy storage elements differs from a same predefined electrical characteristic of the second subset of the plurality of energy storage elements by more than a predefined amount.

In yet another aspect, a non-transitory computer readable stores one or more programs for execution by one or more processors of a device having a plurality of energy storage elements coupled to a subsystem through one or more switches, the one or more programs including instructions for performing any of the methods described herein.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1 is a block diagram illustrating a data storage system 100, in accordance with some embodiments. While some example features are illustrated, various other features have not been illustrated for the sake of brevity and so as not to obscure more pertinent aspects of the example embodiments disclosed herein. To that end, as a non-limiting example, data storage system 100 includes storage device 120 (also sometimes called an information storage device, or a data storage device, or a memory device), which includes host interface 122, serial presence detect (SPD) device 124, data hardening module 126, storage controller 128, one or more non-volatile memory (NVM) controllers 130 such as flash controllers, and non-volatile memory (e.g., one or more NVM device(s) 140, 142 such as one or more flash memory devices), and is used in conjunction with computer system 110. In some embodiments, storage device 120 includes a single NVM device while in other embodiments storage device 120 includes a plurality of NVM devices. In some embodiments, NVM devices 140, 142 include NAND-type flash memory or NOR-type flash memory. Further, in some embodiments, NVM controller 130 is a solid-state drive (SSD) controller. However, one or more other types of storage media may be included in accordance with aspects of a wide variety of embodiments.

Computer system 110 is coupled to storage device 120 through data connections 101. However, in some embodiments computer system 110 includes storage device 120 as a component and/or sub-system. Computer system 110 may be any suitable computer device, such as a personal computer, a workstation, a computer server, or any other computing device. Computer system 110 is sometimes called a host or host system. In some embodiments, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some embodiments, computer system 110 sends one or more host commands (e.g., read commands and/or write commands) on control line 111 to storage device 120. In some embodiments, computer system 110 is a server system, such as a server system in a data center, and does not have a display and other user interface components.

In some embodiments, storage device 120 includes NVM devices 140, 142 such as flash memory devices (e.g., NVM devices 140-1 through 140-n and NVM devices 142-1 through 142-k) and NVM controllers 130 (e.g., NVM controllers 130-1 through 130-m). In some embodiments, each NVM controller of NVM controllers 130 include one or more processing units (also sometimes called CPUs or processors or microprocessors or microcontrollers) configured to execute instructions in one or more programs (e.g., in NVM controllers 130). In some embodiments, the one or more processors are shared by one or more components within, and in some cases, beyond the function of NVM controllers 130. NVM devices 140, 142 are coupled to NVM controllers 130 through connections that typically convey commands in addition to data, and optionally convey metadata, error correction information and/or other information in addition to data values to be stored in NVM devices 140, 142 and data values read from NVM devices 140, 142. For example, NVM devices 140, 142 can be configured for enterprise storage suitable for applications such as cloud computing, or for caching data stored (or to be stored) in secondary storage, such as hard disk drives. Additionally and/or alternatively, flash memory (e.g., NVM devices 140, 142) can also be configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile storage controller(s).

In some embodiments, storage device 120 also includes host interface 122, SPD device 124, data hardening module 126, and storage controller 128. Storage device 120 may include various additional features that have not been illustrated for the sake of brevity and so as not to obscure more pertinent features of the example embodiments disclosed herein, and a different arrangement of features may be possible. Host interface 122 provides an interface to computer system 110 through data connections 101.

In some embodiments, data hardening module 126 includes one or more processing units (also sometimes called CPUs or processors or microprocessors or microcontrollers) configured to execute instructions in one or more programs (e.g., in data hardening module 126). In some embodiments, the one or more processors are shared by one or more components within, and in some cases, beyond the function of data hardening module 126. Data hardening module 126 is coupled to host interface 122, SPD device 124, storage controller 128, and NVM controllers 130 in order to coordinate the operation of these components, including supervising and controlling functions such as power up, power down, data hardening, charging energy storage device(s), data logging, and other aspects of managing functions on storage device 120.

Storage controller 128 is coupled to host interface 122, data hardening module 126, and NVM controllers 130. In some embodiments, during a write operation, storage controller 128 receives data from computer system 110 through host interface 122 and during a read operation, storage controller 128 sends data to computer system 110 through host interface 122. Further, host interface 122 provides additional data, signals, voltages, and/or other information needed for communication between storage controller 128 and computer system 110. In some embodiments, storage controller 128 and host interface 122 use a defined interface standard for communication, such as double data rate type three synchronous dynamic random access memory (DDR3). In some embodiments, storage controller 128 and NVM controllers 130 use a defined interface standard for communication, such as serial advance technology attachment (SATA). In some other embodiments, the device interface used by storage controller 128 to communicate with NVM controllers 130 is SAS (serial attached SCSI), or other storage interface. In some embodiments, storage controller 128 includes one or more processing units (also sometimes called CPUs or processors or microprocessors or microcontrollers) configured to execute instructions in one or more programs (e.g., in storage controller 128). In some embodiments, the one or more processors are shared by one or more components within, and in some cases, beyond the function of storage controller 128.

SPD device 124 is coupled to host interface 122 and data hardening module 126. Serial presence detect (SPD) refers to a standardized way to automatically access information about a computer memory module (e.g., storage device 120). For example, if the memory module has a failure, the failure can be communicated with a host system (e.g., computer system 110) through SPD device 124.

Figure 2:
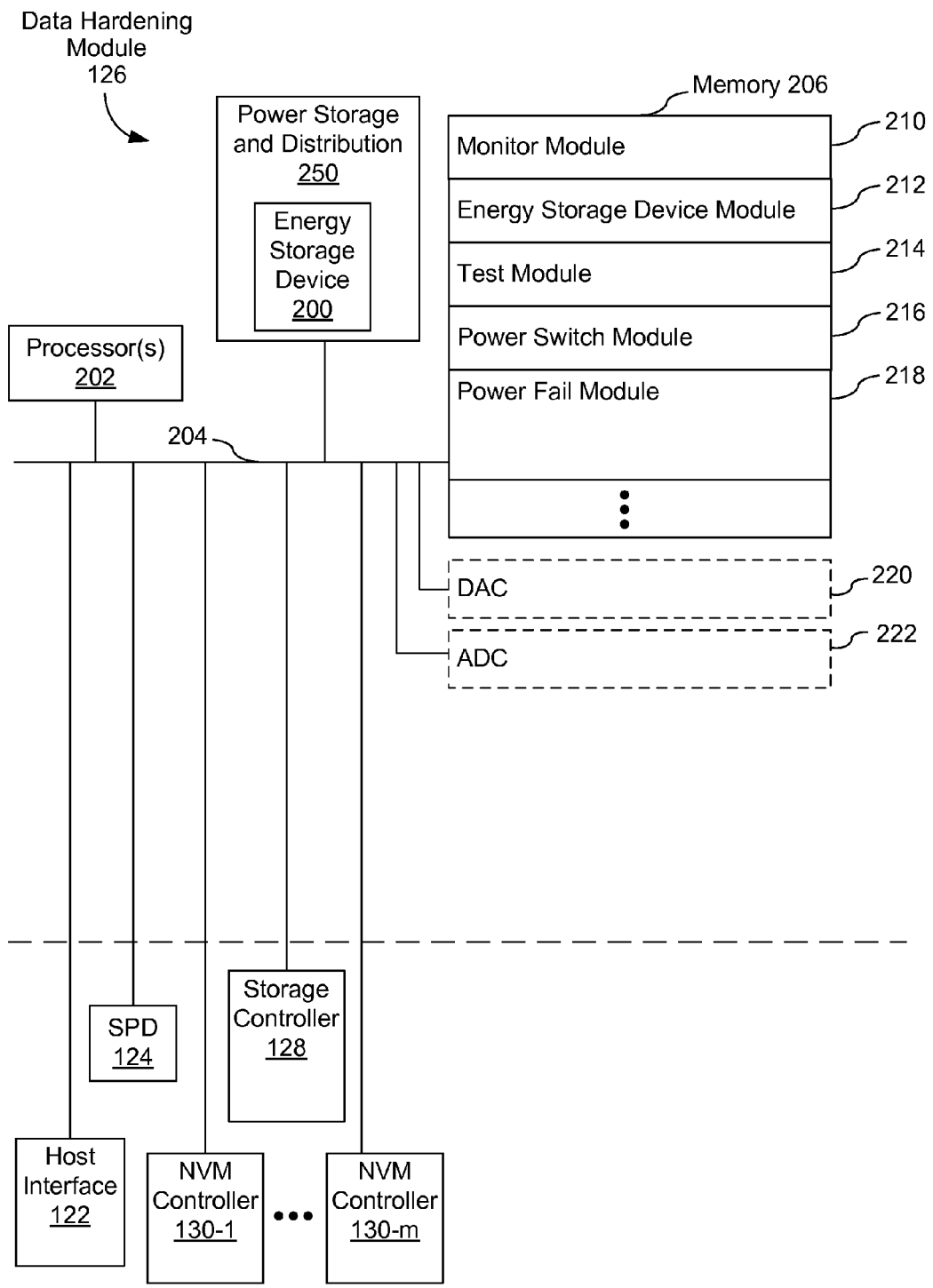
FIG. 2 is a block diagram illustrating a data hardening module, in accordance with some embodiments.

FIG. 2 is a block diagram illustrating data hardening module 126, in accordance with some embodiments. Data hardening module 126 includes power storage and distribution module 250 (including energy storage device 200). In some embodiments, data hardening module also includes one or more processors (also sometimes called CPUs or processing units or microprocessors or microcontrollers) 202 for executing modules, programs and/or instructions stored in memory 206 and thereby performing processing operations, memory 206, and one or more communication buses 204 for interconnecting these components. However, in some other embodiments, the functions described below as being performed by processor(s) 202 are instead performed by storage controller 128.

In some embodiments, power storage and distribution module 250 includes circuitry for monitoring, storing, and distributing power for a storage device (e.g., storage device 120, FIG. 1), including monitoring, controlling, charging, and/or testing energy storage device 200. Alternatively and/or additionally, all or some of the circuitry for monitoring, storing, and distributing power for a storage device (e.g., storage device 120, FIG. 1) is integrated into energy storage device 200. In some embodiments, energy storage device 200 includes one or more energy storage elements. In some embodiments, energy storage device 200 includes one or more capacitors. In some embodiments, energy storage device 200 includes one or more inductors or other passive elements that store energy.

In some embodiments, data hardening module 126 may optionally include one or more digital-to-analog converters (DACs) 220 and/or analog-to-digital converters (ADCs) 222 for converting a digital signal into an analog signal, or converting an analog signal into a digital signal, respectively. In some embodiments, DAC 220 and/or ADC 222 may be implemented as circuitry in power storage and distribution module 250 and/or energy storage device 200. In some embodiments, DAC 220 and/or ADC 222 may be integrated components of the one or more processors 202. Further, in some embodiments, ADC 222 is used in conjunction with energy storage device module 212, for monitoring energy storage device 200.

Communication buses 204 optionally include circuitry (sometimes called a chipset) that interconnects and controls communications between system components. Data hardening module 126 is coupled to host interface 122, SPD device 124, storage controller 128, and NVM controllers 130 (e.g., NVM controllers 130-1 through 130-m) by communication buses 204.

Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 202. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:
- a monitor module 210 that is used for monitoring signals provided to a storage device (e.g., storage device 120, FIG. 1), for example, to monitor and determine whether a power supply voltage provided to the storage device is lower than an under-voltage threshold (and optionally to also determine whether the power supply voltage is higher than an over-voltage threshold);
- an energy storage device module 212 that is used for monitoring, controlling, charging, and/or testing an energy storage device (e.g., energy storage device 200) on the storage device;
- a test module 214 that is used for testing one or more functions of the storage device;
- a power switch module 216 that is used for determining and controlling the voltage that is used to supply power to the storage device; and
- a power fail module 218 that is used for performing a power fail operation in accordance with a determination that a power supply voltage provided to the storage device is lower than an under-voltage threshold (or, optionally, higher than an over-voltage threshold).

In some embodiments, memory 206, or the computer readable storage medium of memory 206 further stores a configuration module for configuring storage device 120 and data hardening module 126, and/or configuration values (such as one or more under-voltage threshold values, and optionally one or more over-voltage threshold values) for configuring data hardening module 126, neither of which is explicitly shown in FIG. 2. In some embodiments, upon power up and upon reset, the configuration module automatically sets the values of one or more configuration parameters of storage device 120 (and, optionally, determines which of two or more power fail modules, test modules, etc. to use) in accordance with the components of storage device 120 (e.g., the type of non-volatile memory components in storage device 120) and/or characteristics of the data storage system 100 that includes storage device 120.

In some embodiments, the monitor module 210 is also used for monitoring and determining whether a power supply voltage provided to the storage device is lower than an under-voltage threshold.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 7A-7E.

Although FIG. 2 shows data hardening module 126, FIG. 2 is intended more as a functional description of the various features which may be present in a data hardening module than as a structural schematic of the embodiments described herein. In practice, and as recognized by those of ordinary skill in the art, items shown separately could be combined and some items could be separated.

Figure 3:
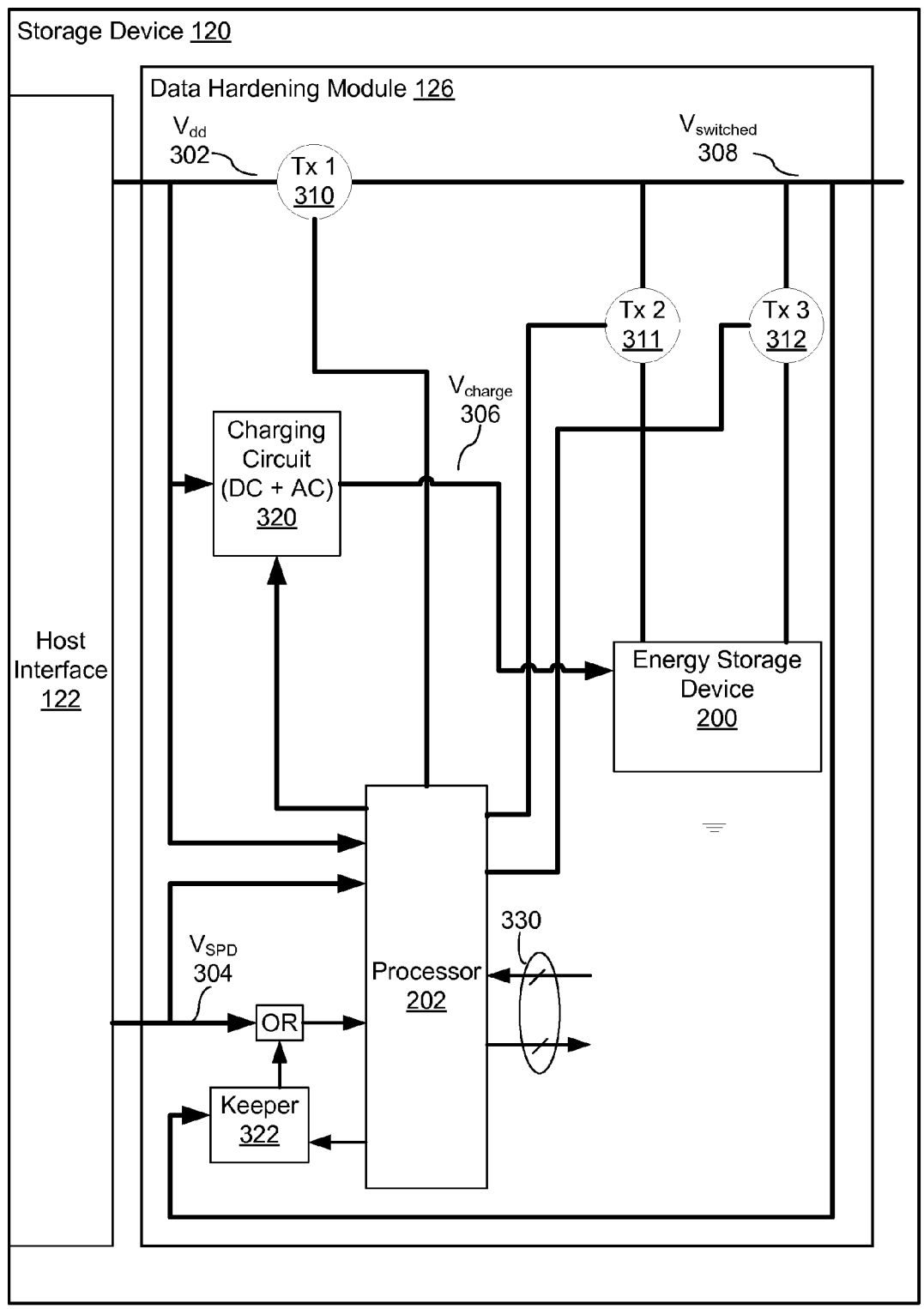
FIG. 3 is a block diagram illustrating a data hardening module, in accordance with some embodiments.

FIG. 3 is a block diagram illustrating data hardening module 126, in accordance with some embodiments. Data hardening module 126 is sometimes called a charging and monitoring apparatus, or alternatively is said to include a charging and monitoring apparatus. While some example features are illustrated, various other features have not been illustrated for the sake of brevity and so as not to obscure more pertinent aspects of the example embodiments disclosed herein. To that end, as a non-limiting example, data hardening module 126 includes processor 202, energy storage device 200, transistors 310-312, charging circuit 320, keeper circuitry 322, voltages $V_{dd}$ 302, $V_{SPD}$ 304, $V_{charge}$ 306, and $V_{switched}$ 308, and connections 330. In some embodiments, $V_{dd}$ 302 is a voltage supplied by a host system (e.g., computer system 110, FIG. 1) and has a target value of 1.5 volts or less. In some embodiments, $V_{charge}$ 306 is a boosted voltage from $V_{dd}$ 302 and has a target value of 12.8 volts. In some embodiments, $V_{charge}$ 306 is used to charge and test energy storage device 200. In some embodiments, $V_{SPD}$ 304 is a voltage supplied for serial presence detect (SPD) functionality and has a target value of 3.3 volts. Further, in some embodiments, only some of transistors 310 to 312 are enabled at any one time. For example, whenever both transistors 311 and 312 are enabled, or whenever either one of transistors 311 and 312 is enabled and the other is disabled (open state), transistor 310 is disabled so as to ensure that power from the data hardening module's energy storage device 200 is not drained to the host system. Furthermore, whenever transistor 310 is enabled, providing power to components of storage device 120 from the host system, transistors 311 and 312 are disabled. In some embodiments, the data hardening circuit's energy storage device 200 stores, immediately prior to a power fail condition being detected, at least approximately 30 to 70 millijoules of energy per NVM controller 130 in storage device 120.

In some embodiments, processor 202 monitors and manages the functionality in data hardening module 126. For example, processor 202 monitors voltages $V_{dd}$ 302 and $V_{SPD}$ 304. If either $V_{dd}$ 302 or $V_{SPD}$ 304 rise above corresponding over-voltage thresholds, processor 202 signals a power fail condition to a plurality of controllers on storage device 120 (e.g., storage controller 128 and NVM controllers 130, FIG. 1). In some embodiments, the over-voltage threshold varies depending on the target value of the voltage. For example, if the target voltage for $V_{dd}$ 302 is 1.5 volts, the over-voltage threshold may be 1.5 volts plus 5% (i.e., 1.575 volts), so processor 202 would signal a power fail condition if $V_{dd}$ 302 is higher than 1.575 volts. In some embodiments, the over-voltage threshold for $V_{dd}$ 302 is different than the over-voltage threshold for $V_{SPD}$ 304. Furthermore, in some embodiments, if either $V_{dd}$ 302 or $V_{SPD}$ 304 fall below corresponding under-voltage thresholds (e.g., 1.425 volts when the target voltage for $V_{dd}$ 302 is 1.5 volts, and 3.135 volts when the target voltage for $V_{SPD}$ 304 is 3.3 volts), processor 202 signals a power fail condition to a plurality of controllers on storage device 120 (e.g., storage controller 128 and NVM controllers 130, FIG. 1).

In some embodiments, during regular operation of storage device 120, $V_{dd}$ 302 is used to supply power to storage device 120. However, during a power fail operation, an energy storage device 200 is used to provide power to storage device 120. In some embodiments, processor 202 includes logic for controlling transistors 310-312, such that processor 202 can control $V_{switched}$ 308 to be voltage from $V_{dd}$ 302 (e.g., during regular operation) or voltage from energy storage device 200 (e.g., during a power fail operation). For example, during regular operation of storage device 120, $V_{dd}$ 302 is used to supply power to storage device 120, so transistor 310 is turned on (e.g., to complete the connection between $V_{dd}$ 302 and $V_{switched}$ 308) and transistors 311 and 312 are turned off (e.g., to disable the connection between energy storage device 200 and $V_{switched}$ 308). However, during a power fail operation, energy storage device 200 is used to provide power to storage device 120, so transistor 310 is turned off (e.g., to disable the connection between $V_{dd}$ 302 and $V_{switched}$ 308), and both transistors 311 and 312 are turned on (e.g., to enable the connection between energy storage device 200 and $V_{switched}$ 308). Alternatively, during a power fail operation, transistor 310 is turned off, and only one of transistors 311 and 312 is turned on (e.g., to enable a connection between $V_{switched}$ 308 and the corresponding energy storage bank 420 or 422 in FIG. 4). As will be described in greater detail below, this may be the case, for example, if a fault has been detected in one or more energy storage elements of the one or more energy storage banks 420 and 422 as a result of increased equivalent series resistance (ESR), changes in the capacitance, inductance, or impedance, a short circuit, an open circuit, and/or other conditions affecting the operability of the one or more energy storage elements.

Figure 4:
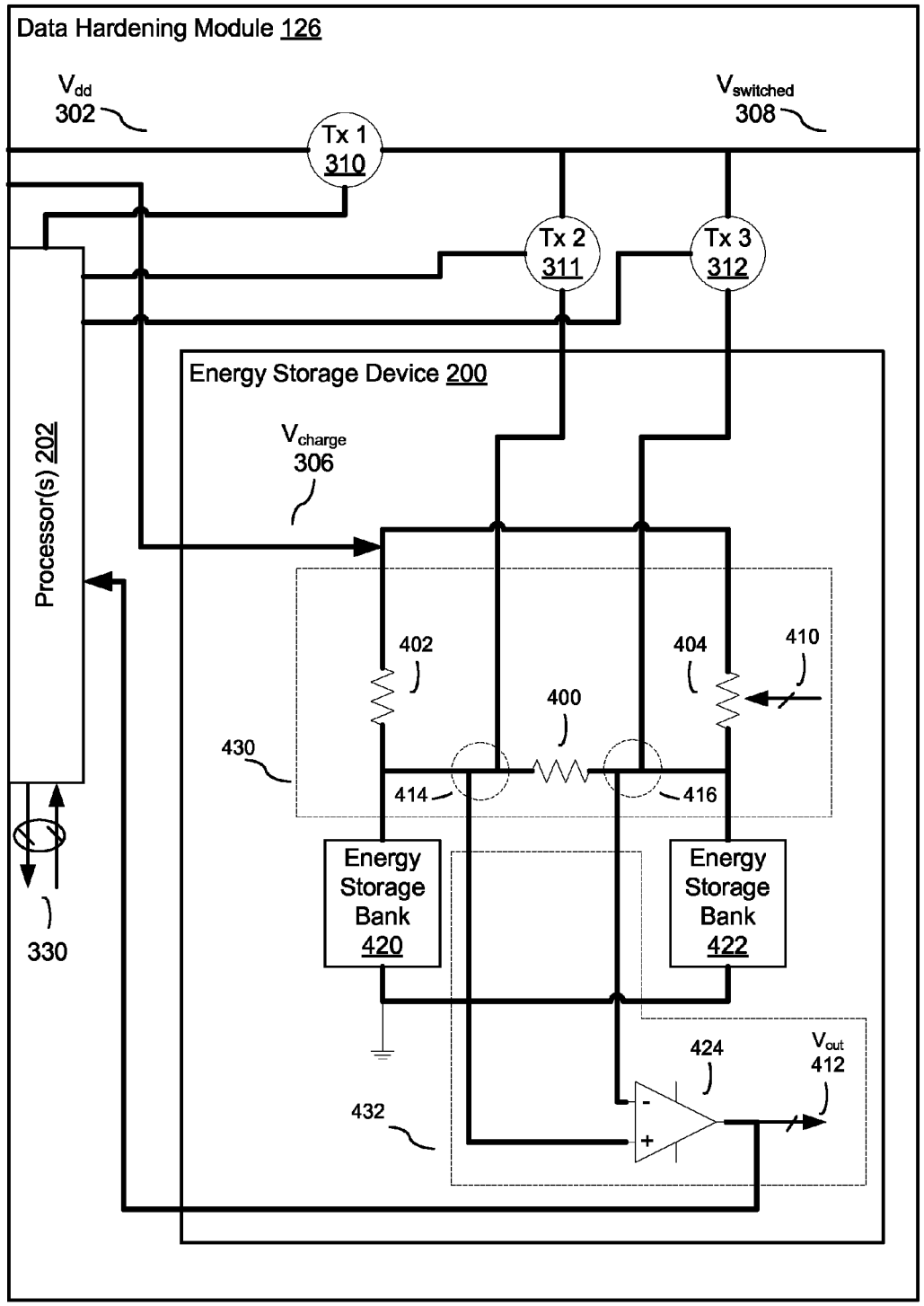
FIG. 4 is a block diagram illustrating an energy storage device, in accordance with some embodiments.

In some embodiments, charging circuit 320 boosts $V_{dd}$ 302 up to $V_{charge}$ 306 (e.g., 1.35 volts or 1.5 volts is boosted up to 12.8 volts), where in some embodiments, energy storage device 200 is charged using $V_{charge}$ 306. In some embodiments, in addition to boosting $V_{dd}$ 302, charging circuit 320 further supplies an alternating current (AC) test voltage. Thus, in some embodiments, $V_{charge}$ 306 is a combined signal consisting of both a direct current (DC) charging voltage (e.g., $V_{AC}$) and an AC test voltage (e.g., $V_{test}$). In some embodiments, the AC test voltage is set by charging circuit 320 to be small enough so as to not degrade the energy storage elements of energy storage banks 420 and 422 (FIG. 4). For example, the AC test voltage is sometimes set to approximately 5% of $V_{AC}$ (e.g., $V_{AC}$=12.8 volts, $V_{test}$=500 millivolts peak-to-peak at 500 Hz to 1 kHz). Furthermore, in some embodiments, and as described in greater detail below, charging circuit 320 sets and controls the duty cycle and/or other characteristics (e.g., sinusoidal or rectangular waveform) of the AC test voltage. In some embodiments, charging circuit 320 is controlled and enabled by processor 202.

Further, in some embodiments, $V_{switched}$ 308 is used as an input to keeper circuitry 322, which along with $V_{SPD}$ 304 provides power to processor 202. During a power fail operation, $V_{switched}$ 308 is provided via keeper circuitry 322 to processor 202 so as to provide power to processor 202 during the power fail operation. In some embodiments, $V_{SPD}$ 304 provides power to keeper circuitry 322. Furthermore, in some embodiments, $V_{SPD}$ 304 is provided to storage device 120 before $V_{dd}$ 302 is provided to storage device 120, allowing devices in storage device 120 to operate before main power $V_{dd}$ 302 is provide to storage device 120.

In some embodiments, processor 202 has one or more connections 330 used to monitor and control other functions within storage device 120. For example, in some embodiments, the outputs of one or more optional features of monitoring circuit 432 (e.g., second comparator output 520 in FIG. 5A, ADC output 522 in FIG. 5B, servo circuit output 524 in FIG. 5C, or phase comparison signal 526 in FIG. 5D) are coupled to processor 202 through connections 330. In some embodiments, a fault signal (e.g., fault indicator output signal $V_{out}$ 412), which is produced by monitoring circuit 432 and provided to processor 202 through one or more connections 330, indicates that a fault has been detected in one or more energy storage elements of the one or more energy storage banks 420 or 422 (FIG. 4). Consequently, in some embodiments, and as described previously, processor 202 will enable and/or disable one or more transistors 310 to 312 during a power fail operation in accordance with the fault signal provided to processor 202 through one or more connections 330.

FIG. 4 is a block diagram illustrating an energy storage device 200, in accordance with some embodiments. While some example features are illustrated, various other features have not been illustrated for the sake of brevity and so as not to obscure more pertinent aspects of the example embodiments disclosed herein. To that end, as a non-limiting example, energy storage device 200 includes bridge circuit 430, energy storage banks 420 and 422, monitoring circuit 432, and voltages $V_{charge}$ 306 and $V_{out}$ 412. In some embodiments, bridge circuit 430 includes resistive elements 400, 402, and 404. Further, in some embodiments, monitoring circuit 432 includes a first comparator 424. In some embodiments, $V_{charge}$ 306 is provided for concurrently charging and monitoring energy storage banks 420 and 422, where monitoring circuit 424 is configured to produce fault indicator output signal $V_{out}$ 412 when an imbalance has been detected across bridge circuit 430.

Energy storage banks 420 and 422, coupled to a subsystem of storage device 120 (e.g., in FIG. 1, the components of storage device 120 shown to the right of data hardening module 126) through transistors 311 and 312, supply power to the subsystem of storage device 120 during a power fail operation. In some embodiments, energy storage banks 420 and 422 each comprise one or more energy storage elements. For example, in some embodiments, the one or more energy storage elements of energy storage banks 420 and 422 include one or more capacitors. In some embodiments, the one or more energy storage elements include one or more inductors, or other passive elements that store energy. Furthermore, in some embodiments, a first subset of energy storage elements is coupled to a first node (e.g., node 414) and a second subset of energy storage elements, distinct from the first subset, is coupled to a second node (e.g., node 416). In some embodiments, a plurality of transistors may implemented to couple various subsets of energy storage elements in energy storage banks 420 and 422 to their corresponding nodes, such that processor 202 can selectively test specific subsets of energy storage elements. Alternatively, some embodiments include one or more demultiplexers (not explicitly shown in FIG. 4), controlled by processor 202 and each coupled to one of nodes 402 and 404, for selectively coupling and testing various subsets of energy storage elements.

In some embodiments, bridge circuit 430 includes a plurality of resistive elements 400, 402, and 404. In some embodiments, resistive element 400 is a measurement resistor coupled between nodes 414 and 416, and provides a mechanism by which a fault can be detected in the energy storage elements of energy storage banks 420 and 422. In particular, when the impedance of resistive elements 402 and 404 are equal (or approximately equal), an AC voltage detected across resistive element 400 (in response to $V_{charge}$ 306 which includes at least an AC test voltage) indicates an imbalance between energy storage banks 420 and 422, with respect to some predefined electrical characteristic (e.g., capacitance, ESR, impedance, etc.). In some embodiments, one or both of resistive elements 402 and 404 are variable resistors. Further, in some embodiments, resistive elements 402 and 404 are digitally programmable. By adjusting the resistive elements coupled between $V_{charge}$ 306 and nodes 414 and 416 (i.e., "trim" resistors), bridge circuit balancing can be performed. Bridge circuit balancing can be used, for example: 1) to tune out small differences in the energy storage elements of the energy storage banks at manufacturing time, 2) to adjust fault sensitivity, and 3) to adjust the charging current. For example, small differences in the energy storage elements of the energy storage banks are tuned out at manufacturing time by adjusting one or more of the resistive elements until the difference between the ESR of energy storage bank 422 in series with resistor 404 and the ESR of energy storage bank 420 in series with resistor 402 is minimized. Optionally, output 410 of servo circuit 514 is coupled to and configured to adjust at least one of resistive elements 402 and 404 in accordance with fault indicator output signal, $V_{out}$ 412, as described in more detail below.

In some embodiments, charging circuit 320 is coupled to a first node (e.g., node 414) and a second node (e.g., node 416) through bridge circuit 430, and provides $V_{charge}$ 306, a combined charging voltage consisting of a DC charging voltage (e.g., $V_{AC}$) and an AC test voltage (e.g., $V_{test}$), to both a first subset of energy storage elements (e.g., energy storage bank 420) and a second subset of energy storage elements (e.g., energy storage bank 422). In some embodiments, the AC test voltage is applied continuously. Alternatively, in some embodiments, the AC test voltage is applied in accordance with a predefined frequency and duty cycle (e.g., once every S seconds, such as 3 seconds, for M milliseconds, such as 5 milliseconds). In some embodiments, the AC test voltage is applied on a schedule (e.g., every Monday, or every hour).

In some embodiments, monitoring circuit 432 produces the fault indicator output signal in accordance with the predefined duty cycle of the applied AC test voltage. In some embodiments, the AC test voltage comprises a sequence of positive pulses only, so that capacitors in energy storage bank 420 and 422 only charge above, and do not discharge below, the charge level they would achieve when only the DC charging voltage is applied to the capacitors. Stated another way, the DC charging voltage and AC test voltage are combined to produce a combined charging voltage (e.g., $V_{charge}$ 306) that is no less than the DC charging voltage at all times. In some embodiments, the positive pulses have sinusoidal or substantially sinusoidal waveforms (i.e., are sinusoidal or substantially sinusoidal in shape). Alternatively, the positive pulses have rectangular waveforms (i.e., are rectangular in shape).

In some embodiments, monitoring circuit 432 is coupled to a first node (e.g., node 414) and a second node (e.g., node 416), and is configured to produce a fault indicator output signal (e.g., $V_{out}$ 412). In some embodiments, the fault indicator output signal comprises a predefined fault signal if a predefined electrical characteristic of a first subset of energy storage elements differs from a same predefined electrical characteristic of a second subset of energy storage elements by more than a predefined amount. For example, monitoring circuit 432 may be configured to produce a predefined fault signal of 1.8 volts or greater if the capacitance of energy storage bank 420 differs from the capacitance of energy storage bank 422 by 100 µF or more. In another example, monitoring circuit 432 may also produce a predefined fault signal of 1.8 volts or greater if the ESR of energy storage bank 420 differs from the ESR of energy storage bank 422 by twenty percent or more of the normal ESR (e.g., 0.02 ohms or more when the normal ESR is about 0.1 ohm). In some embodiments, the magnitude of the fault indicator output signal (e.g., $V_{out}$ 412) produced by monitoring circuit 432 is proportional to the magnitude of the difference between a predefined electrical characteristic of the first and second subset of energy storage elements. In some embodiments, monitoring circuit 432 is configured to produce a predefined fault signal corresponding to one or more energy storage elements exhibiting an open circuit, and a predefined fault signal corresponding to one or more energy storage elements exhibiting a short circuit.

In some embodiments, monitoring circuit 432 comprises a first comparator (e.g., comparator 424), where the first comparator comprises a first input coupled to a first node (e.g., node 414) of the bridge circuit, a second input coupled to a second node (e.g., node 416) of the bridge circuit, and an output. In some embodiments, the output of the first comparator 424 is coupled to processor 202. Furthermore, in some embodiments, one or more processors 202 are programmed to respond to the production of the fault indicator output signal (e.g., $V_{out}$ 412) comprising the predefined fault signal by performing at least one action selected from the group consisting of: logging the fault indicator output signal, signaling a host system (e.g., computer system 110) of an error event, and adjusting an amount of data (e.g., reducing the amount of data) to be stored to non-volatile memory during a power fail operation. In some embodiments, NVM and instructions comprise firmware. In some embodiments, the fault indicator output signal is logged only if the predefined fault signal is produced. In some embodiments, if fault indicator output signal exceeds a threshold (e.g., $V_{out}$=2 volts), a write cache of the storage device (e.g., storage device 120) is limited to a fraction of its capacity (e.g., 50%). In some embodiments, the write cache is turned off completely, and data transfer is limited to saving meta data.

FIGS. 5A-5D illustrate various optional features of a monitoring circuit, in accordance with some embodiments. In some embodiments, two or more of these features are included in a monitoring circuit of an energy storage device.

Figure 5A:
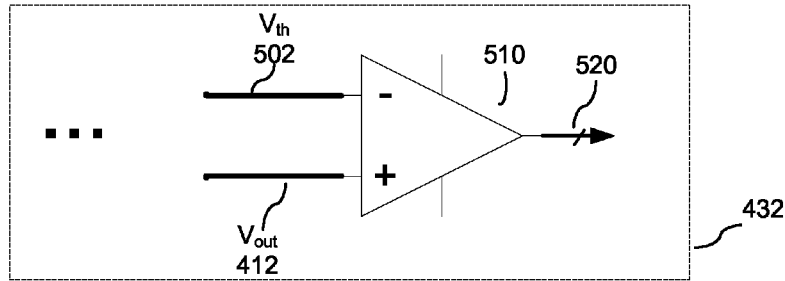
FIGS. 5A-5D illustrate various optional features of a monitoring circuit, in accordance with some embodiments.

FIG. 5A illustrates an embodiment in which monitoring circuit 432 further comprises a second comparator (e.g., second comparator 510), where the second comparator comprises a first input coupled to the output 412 of the first comparator 424 (FIG. 4), a second input coupled to a reference voltage (e.g., $V_{th}$ 502), and an output. Furthermore, in some embodiments, second comparator 510 is configured to produce the predefined fault signal on second comparator output 520 if a predefined electrical characteristic of a first subset of energy storage elements differs from the same predefined electrical characteristic of a second subset of energy storage elements by more than a predefined amount. In some embodiments, the predefined amount corresponds to the reference voltage coupled to the second input of the second comparator 510. In an example, the reference voltage is threshold voltage $V_{th}$ 502, equal to 1.8 volts, which corresponds to the voltage produced by the first comparator 424 if the first and second subsets of energy storage elements differ in ESR by at least twenty percent of the nominal or normal ESR for the first and second subsets of energy storage element (e.g., by 0.02 ohms or more). Thus, for example, when the difference in ESR between the first and second subsets of energy storage elements is greater than 2 ohms, the output of the first comparator is greater than reference voltage 502 (e.g., $V_{out}$>1.8 volts, $V_{th}$=1.8 volts), and as a result second comparator 510 produces the predefined fault signal on its output. Optionally, second comparator output 520 is coupled to processor 202 through connections 330 and provides the predefined fault signal if produced by second comparator 510.

Figure 5B:
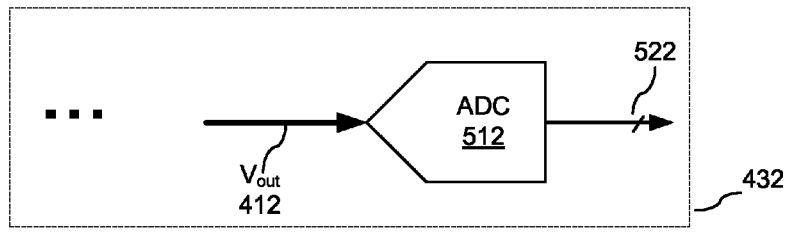

FIG. 5B illustrates an embodiment in which monitoring circuit 432 further includes an analog-to-digital converter (ADC) (e.g., ADC 512), where the ADC has a first input coupled to the output 412 of the first comparator 424, and an output 522. In some embodiments, ADC 512 converts the fault indicator output signal $V_{out}$ 412 from an analog signal to a digital signal. Optionally, ADC output 522 is coupled to processor 202 through connections 330 and provides the converted digital signal. In some embodiments, ADC 512 is an existing component of the one or more processors 202 (FIG. 4).

Figure 5C:
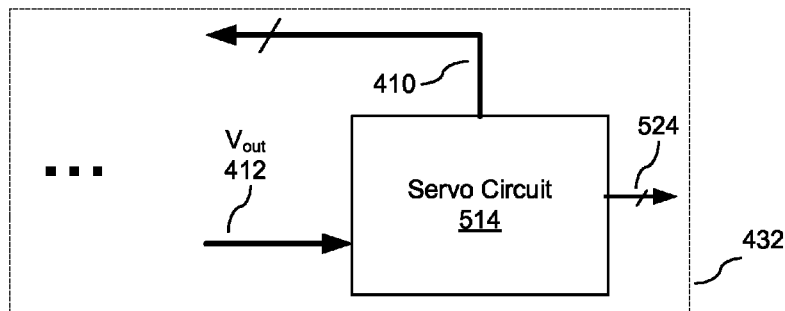

FIG. 5C illustrates an embodiment in which monitoring circuit 432 includes a servo circuit (e.g., servo circuit 514), where the servo circuit has a first input coupled to the output 412 of the first comparator 424, an output 524 coupled to at least two adjustable resistive elements in the bridge circuit (e.g., resistive elements 402 and 404). In some embodiments, servo circuit 514 is configured to adjust at least one of adjustable resistive elements 402 and 404 until fault indicator output signal $V_{out}$ 412 at the output of first comparator 424 is minimized or satisfies a predefined null condition. For example, in the context of FIG. 4, the output of first comparator 424 is minimized when the difference between the ESR of energy storage bank 422 in series with resistor 404 and the ESR of energy storage bank 420 in series with resistor 402 is minimized. Furthermore, in some embodiments, servo circuit 514 is configured to produce a servo circuit fault signal at servo circuit output 524 in accordance with a determination that the first comparator output does not satisfy the predefined null condition (e.g., $V_{out}$=0.3 volts peak-to-peak), or in accordance with a determination that the adjustment to the at least one of the adjustable resistive elements exceeds a predefined limit (e.g., compensating either resistive element by more than 2 ohms).

Figure 5D:
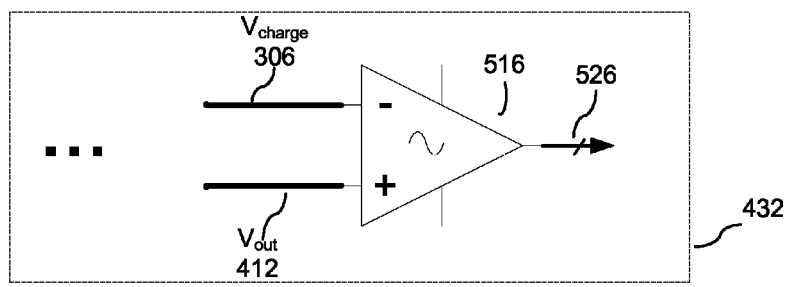
Figure 6A:
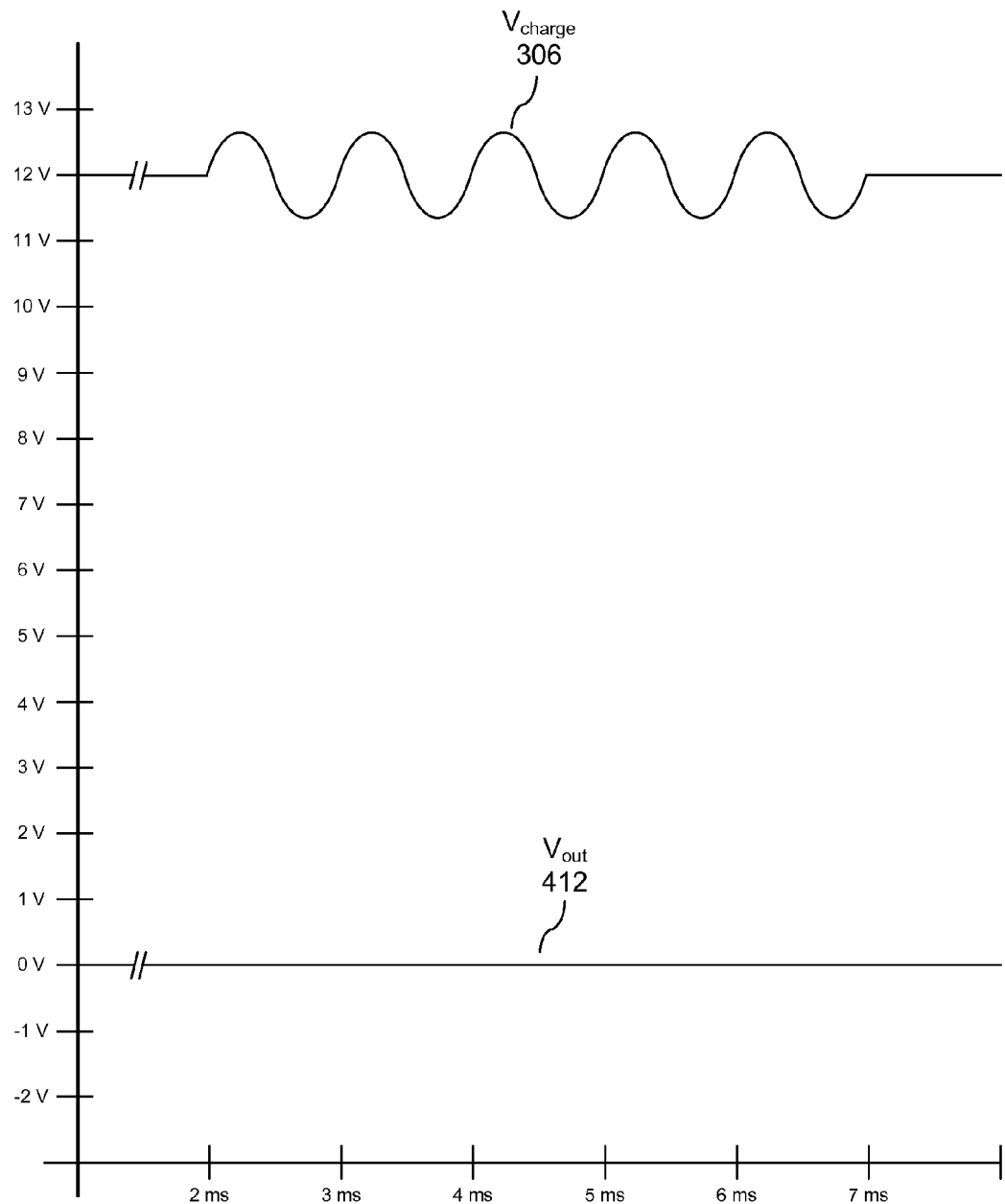
FIG. 6A is a prophetic illustration of a continuous time-domain plot of $V_{charge}$ and $V_{out}$ when an imbalance is not detected between energy storage banks, in accordance with some embodiments.
Figure 6B:
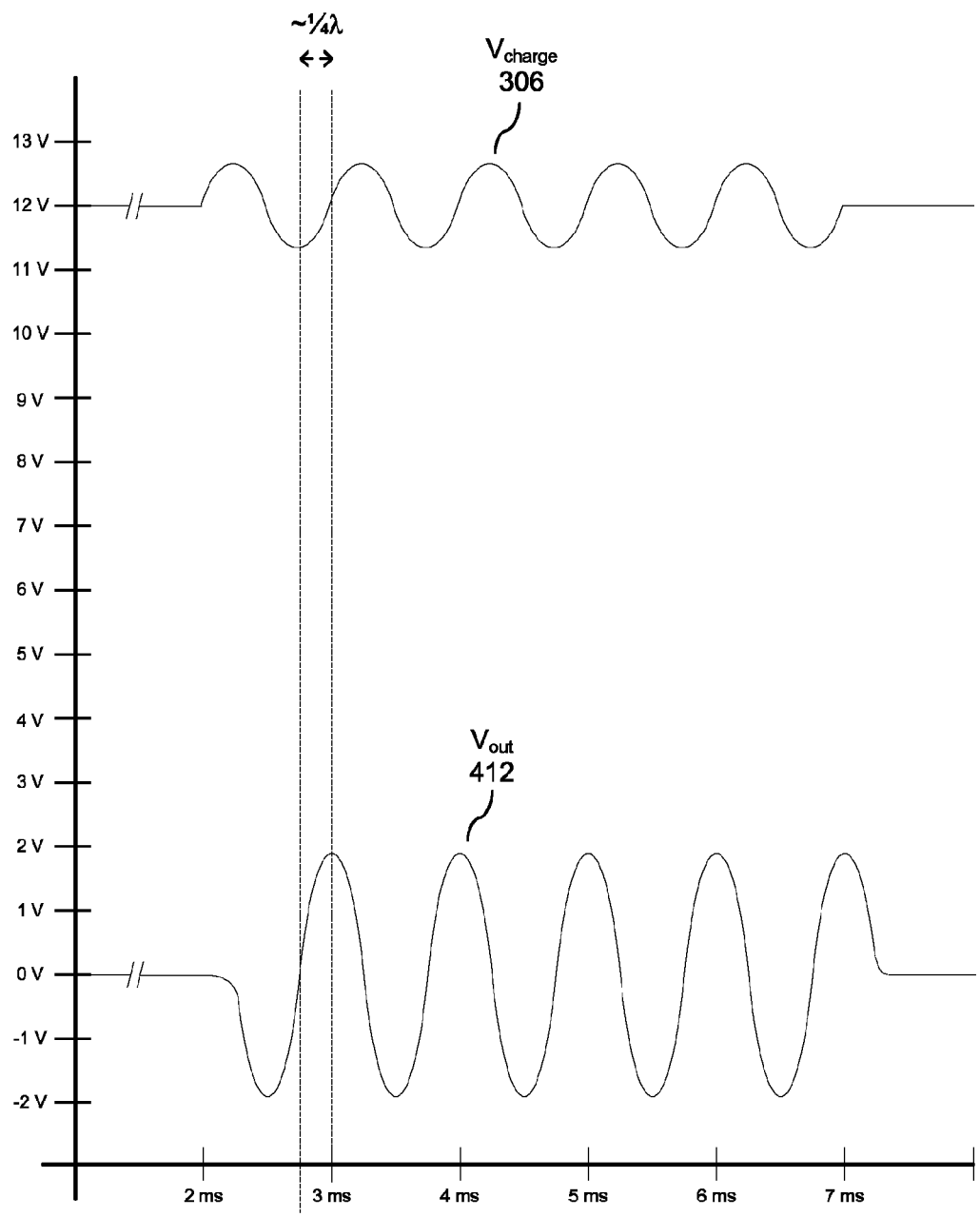
FIGS. 6B and 6C are prophetic illustrations of a continuous time-domain plot of $V_{charge}$ and $V_{out}$ when an imbalance is detected between energy storage banks, in accordance with some embodiments.
Figure 6C:
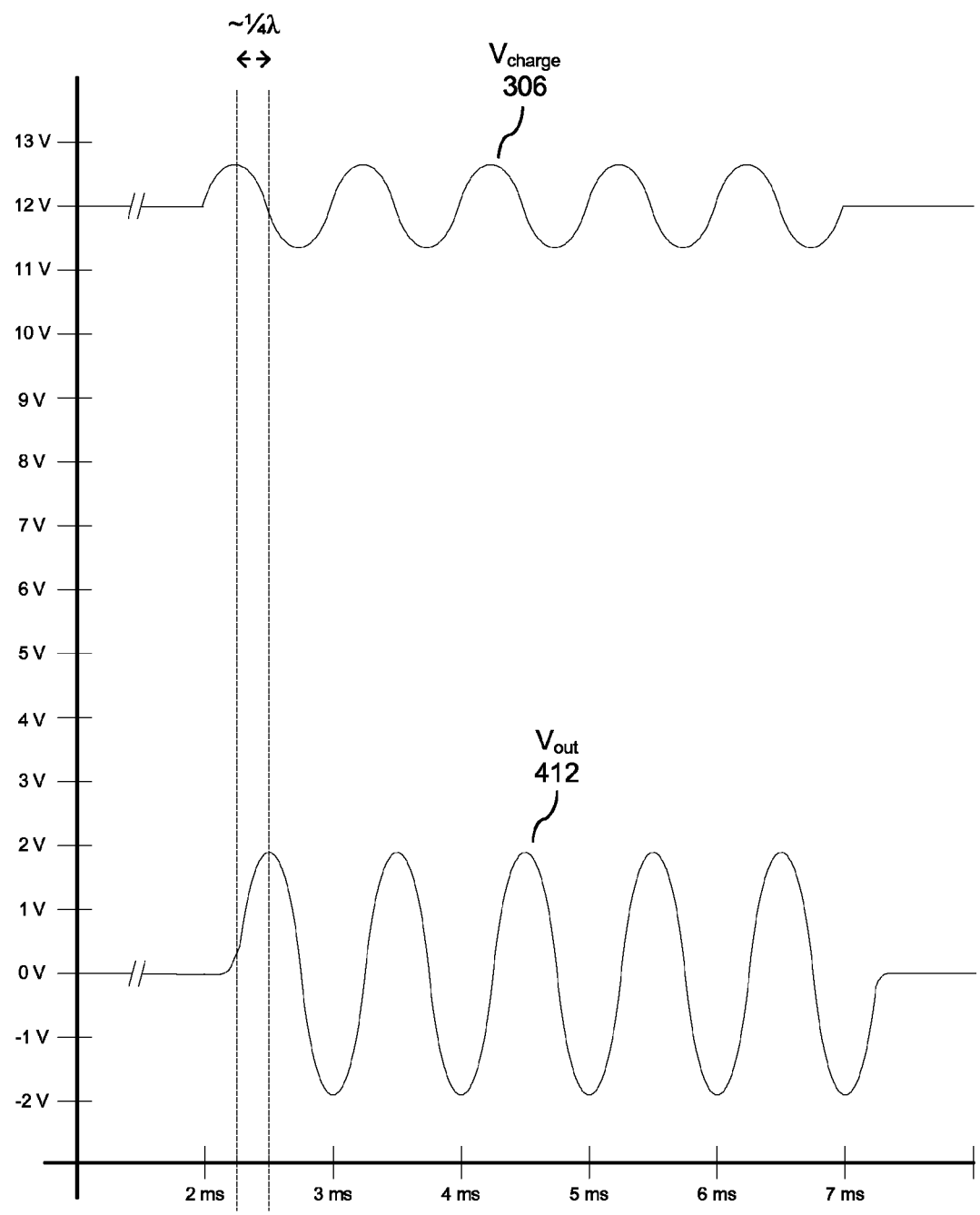
Figure 7B:
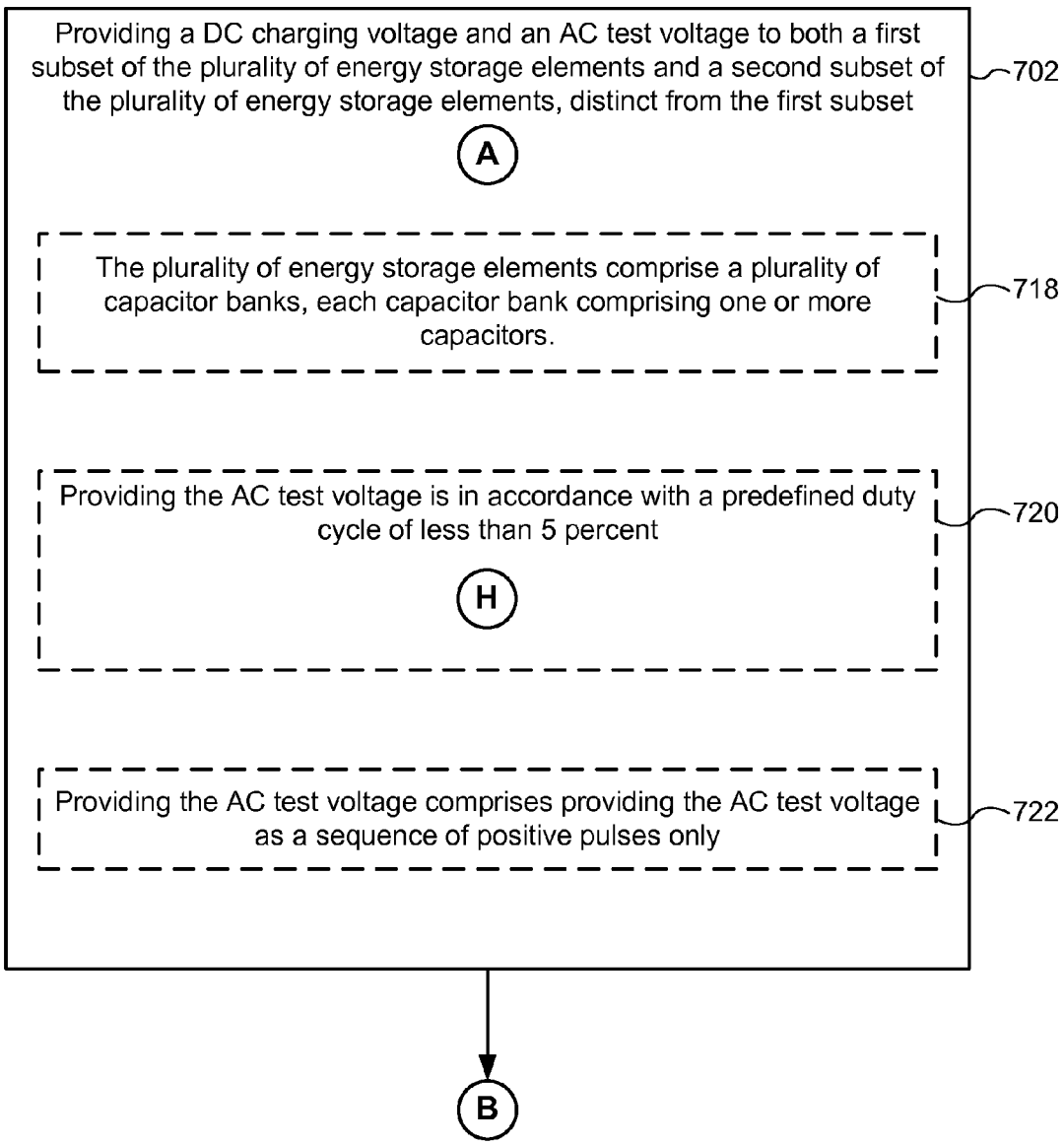
Figure 7C:
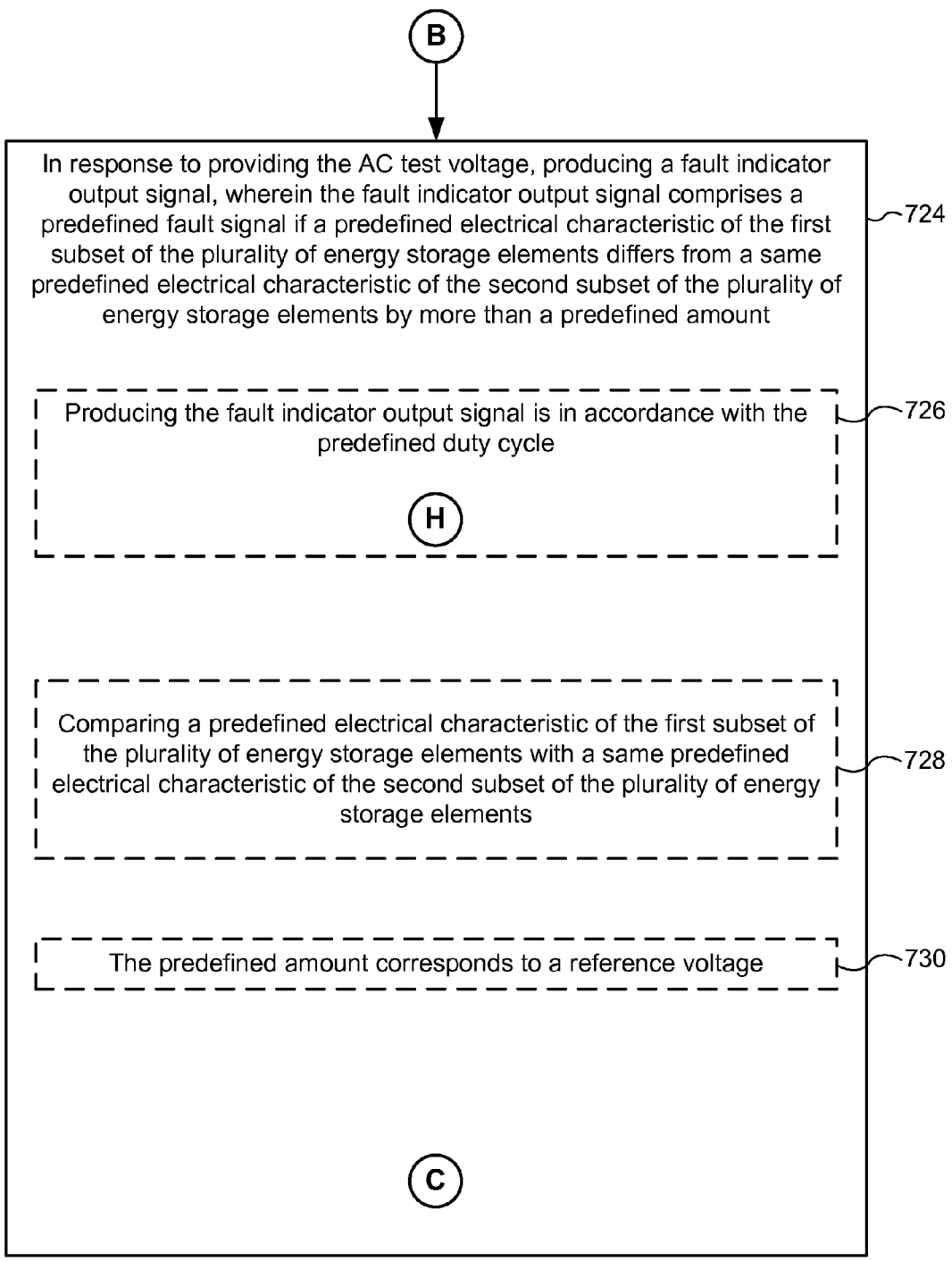
Figure 7D:
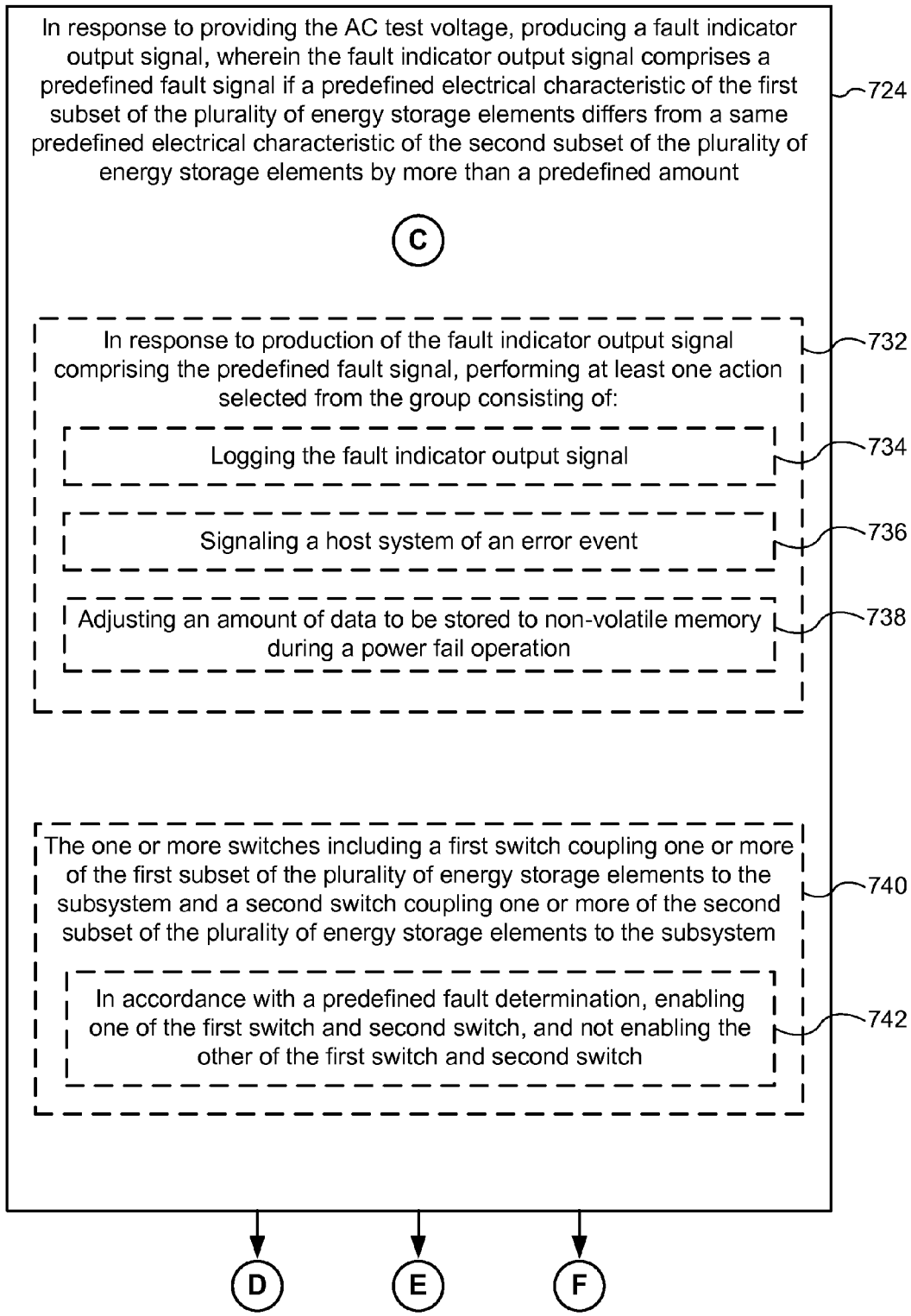
Figure 7E:
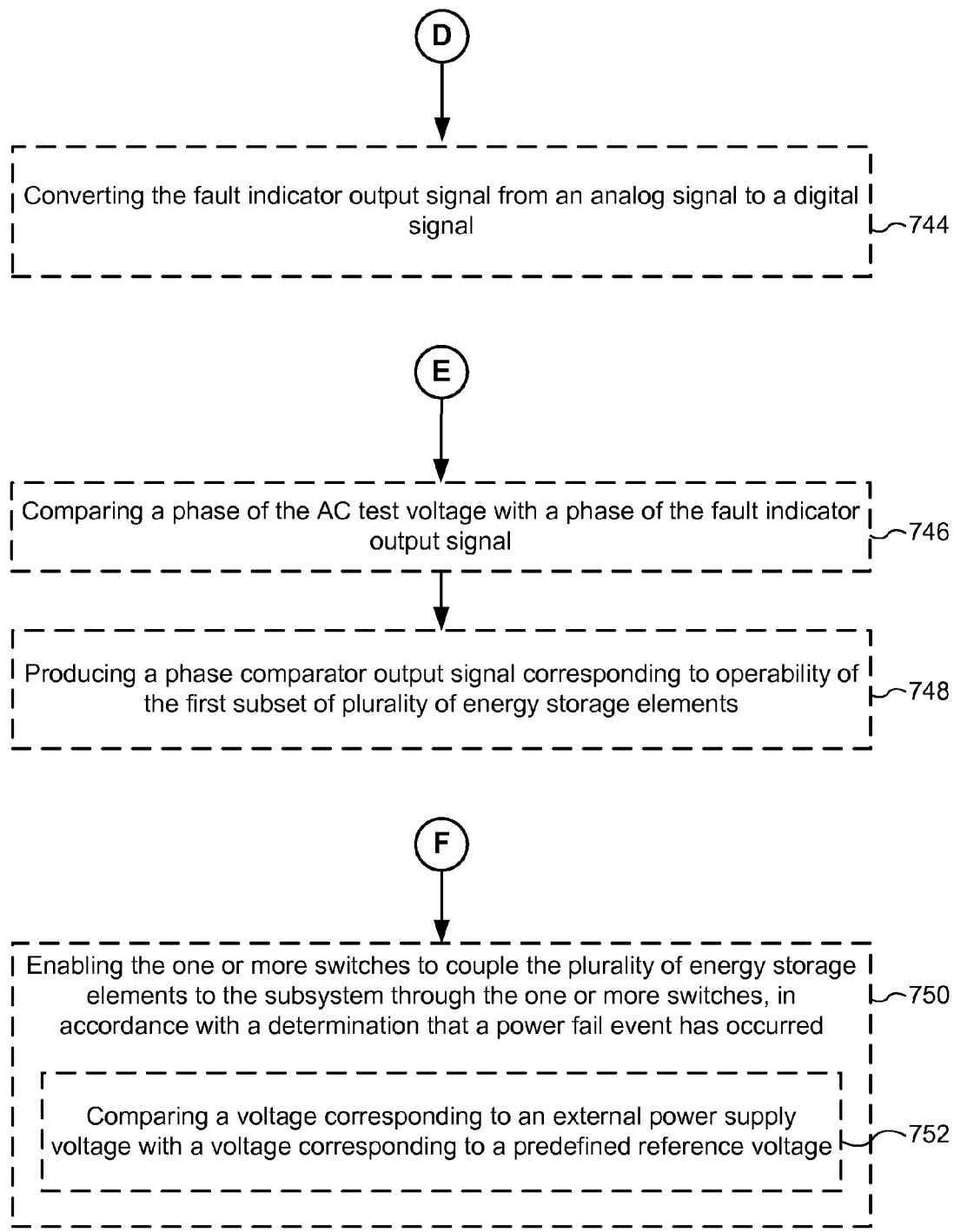

FIG. 5D illustrates an embodiment in which monitoring circuit 432 includes a phase comparator (e.g., phase comparator 516), where the phase comparator has a first input coupled to the output 412 of the first comparator 424, a second input coupled to the AC test voltage (e.g., $V_{charge}$ 306, which includes $V_{test}$), and an output 526. In some embodiments, the phase comparator is for comparing a phase of the AC test voltage (e.g., $V_{charge}$ 306) with a phase of the output of the first comparator (e.g., fault indicator output signal $V_{out}$ 412), and for producing a phase comparison signal (output 526) corresponding to the operability of the first and second subsets of energy storage elements. More specifically, as shown in FIGS. 6A-6C, fault indicator output signal $V_{out}$ 412 will be shifted in phase relative to AC test voltage $V_{test}$ depending on whether changes in a predefined electrical characteristic (e.g., capacitance, ESR, impedance, etc.) are detected in energy storage bank 420 or 422. Alternatively, the phase of the AC test voltage is compared with the phase of the signal at node 414 or node 416.

FIG. 6A illustrates a prophetic continuous time-domain plot of $V_{charge}$ and $V_{out}$ when an imbalance is not detected between two energy storage banks (e.g., banks 420, 422, FIG. 4), in accordance with some embodiments. Specifically, if both energy storage banks are operating properly, the first comparator output (e.g., fault indicator output signal $V_{out}$ 412) will be null or less than a threshold, in which case monitoring circuit 432 will, in effect, ignore the phase comparison signal 526 because the phase comparison signal indicates that the energy storage elements of both energy storage banks are working within specification. Although FIG. 6A illustrates fault indicator output signal $V_{out}$ 412 as null, a $V_{out}$ signal that is close to null, or less than a predefined threshold, similarly indicates that the energy storage elements of both energy storage banks are working within specification.

FIGS. 6B and 6C illustrate a prophetic continuous time-domain plot of $V_{charge}$ and $V_{out}$ when an imbalance is detected between the energy storage banks, in accordance with some embodiments.

As shown in FIG. 6B, in some embodiments, the peak of the first comparator output (e.g., fault indicator output signal $V_{out}$ 412) trails the trough of the AC test voltage (e.g., $V_{charge}$ 306, which includes $V_{test}$) by a phase of approximately a quarter of a cycle (e.g., approximately $\frac{1}{4}\pi$ or $\frac{1}{2}\pi$) of the $V_{out}$ waveform, indicating that a fault has been detected in the energy storage bank 422 coupled to the negative input of first comparator 424. For example, assuming FIG. 6B represents a simulation of the energy storage device 200 of FIG. 4 in response to applying an AC test voltage, the observed phase difference between $V_{charge}$ and $V_{out}$ indicates that energy storage bank 422 is operating below specification. The detected fault may be a consequence of changes in capacitance, ESR, impedance, and/or some other predefined electrical characteristic of energy storage bank 422.

As shown in FIG. 6C, in some embodiments, the peak of the first comparator output (e.g., fault indicator output signal $V_{out}$ 412) trails the peak of the AC test voltage (e.g., $V_{charge}$ 306, which includes $V_{test}$) by a phase of approximately a quarter of a cycle of the $V_{out}$ waveform, indicating that a fault has been detected in the energy storage bank 420 coupled to the positive input of first comparator 424. For example, assuming FIG. 6C represents a simulation of the energy storage device 200 of FIG. 4 in response to applying an AC test voltage, the observed phase difference between $V_{charge}$ and $V_{out}$ indicates that energy storage bank 420 is operating below specification. As described previously, the detected fault may be a consequence of changes in capacitance, ESR, impedance, and/or some other predefined electrical characteristic of energy storage bank 420.

FIGS. 7A-7E illustrate a flowchart representation of a method 700 of concurrently charging and monitoring the operability of a plurality of energy storage elements in memory devices, in accordance with some embodiments. A storage device (e.g., storage device 120, FIG. 1) coordinates and manages multiple sub-system components to concurrently charging and monitoring the operability of a plurality of energy storage elements of energy storage device 200. In some implementations, method 700 is performed by a storage device (e.g., storage device 120, FIG. 1) or one or more components of the storage device (e.g., data hardening module 126, FIG. 1). In some embodiments, method 700 is governed by instructions that are stored in a non-transitory computer readable storage medium and that are executed by one or more processors of a device, such as the one or more processors 202 of data hardening module 126.

A storage device (e.g., storage device 120, FIG. 1) provides (702) a DC charging voltage and an AC test voltage to both a first subset of the plurality of energy storage elements and a second subset of the plurality of energy storage elements, distinct from the first subset. For example, in FIG. 4, $V_{charge}$ 306 is a combined charging voltage consisting of a DC charging voltage (e.g., $V_{AC}$) and an AC test voltage (e.g., $V_{test}$) provided to both a first subset of energy storage elements (e.g., energy storage bank 420) and a second subset of energy storage elements (e.g., energy storage bank 422). In some embodiments, the AC test voltage is provided in accordance with a predefined duty cycle (720) of less than 5 percent. For example, the AC test voltage is applied once every S seconds, such as 3 seconds, for M milliseconds, such as 5 milliseconds. Optionally, the AC test voltage is applied continuously, or on a schedule (e.g., every Monday, or every hour). In some embodiments, providing the AC test voltage includes providing the AC test voltage as a sequence of positive pulses only (722). Optionally, in some embodiments, the positive pulses have sinusoidal or substantially sinusoidal waveforms (i.e., are sinusoidal or substantially sinusoidal in shape), while in other embodiments, the positive pulses have rectangular waveforms (i.e., are rectangular in shape). In some implementations, charging circuit 320 (FIG. 3) sets and controls the duty cycle and/or other characteristics (e.g., sinusoidal or rectangular waveform) of the AC test voltage.

The plurality of energy storage elements are coupled (704) to a subsystem through one or more switches (e.g., transistors 310-312, FIG. 4). In some embodiments, the plurality of energy storage elements (e.g., energy storage banks 420 and 422, FIG. 4) includes a plurality of capacitor banks (718), each capacitor bank including one or more capacitors. In some embodiments, the one or more energy storage elements include one or more inductors, or other passive elements that store energy.

Furthermore, the first subset of the plurality of energy storage elements is coupled (706) to a first node of a bridge circuit, and the second subset of the plurality of energy storage elements is coupled (708) to a second node of the bridge circuit, wherein the bridge circuit includes a plurality of resistive elements, the plurality of resistive elements including a measurement resistor coupled between the first and the second node of the bridge circuit. In some embodiments, the plurality of resistive elements in the bridge circuit includes an adjustable resistive element (710), or at least two adjustable resistive elements (714). Some implementations include adjusting one (712) or at least one (716) of the adjustable resistive elements (e.g., resistive elements 402 and 404, FIG. 4) in the bridge circuit until a difference between a signal on the first node of the bridge circuit and a signal on the second node of the bridge circuit is minimized or satisfies by a predefined null condition. Optionally, the output of a servo circuit (e.g., servo circuit 514, FIG. 5C) is coupled to at least one of the adjustable resistive elements, and the servo circuit is configured to adjust the resistive elements in accordance with a fault indicator output signal (e.g., $V_{out}$ 412, FIG. 4).

In response to providing the AC test voltage, a fault indicator output signal is produced (724), wherein the fault indicator output signal includes a predefined fault signal if a predefined electrical characteristic of the first subset of the plurality of energy storage elements differs from a same predefined electrical characteristic of the second subset of the plurality of energy storage elements by more than a predefined amount. In some embodiments, the predefined electrical characteristic is a capacitance, ESR, impedance, and/or some other predefined electrical characteristic of the energy storage elements (e.g., in energy storage banks 420 and 422), and the predefined amount corresponds to a difference in the predefined electrical characteristics of the first and second subsets. For example, in FIG. 4, monitoring circuit 432 produces a predefined fault signal of 1.8 volts or greater if the capacitance of energy storage bank 420 differs from the capacitance of energy storage bank 422 100 µF or more. In some embodiments, the magnitude of the produced fault indicator output signal (e.g., $V_{out}$ 412) is proportional to the magnitude of the difference between a predefined electrical characteristic of the first and second subsets of energy storage elements. Furthermore, in some implementations, a predefined fault signal is produced that corresponds to one or more energy storage elements (e.g., in energy storage banks 420 and/or 422) exhibiting an open circuit, or alternatively a short circuit.

In some implementations, when the AC test voltage is provided in accordance with a predefined duty cycle (720), the fault indicator output signal is produced in accordance with the predefined duty cycle (726).

In some embodiments, a predefined electrical characteristic of the first subset of the plurality of energy storage elements is compared (728) with a same predefined electrical characteristic of the second subset of the plurality of energy storage elements. In some implementations, a first comparator (e.g., comparator 424, FIG. 4) performs the comparing step 728, where the first comparator has a first input coupled to a first node (e.g., node 414, FIG. 4), a second input coupled to a second node (e.g., node 416, FIG. 4), and an output.

Further, in some implementations, the predefined amount corresponds to a reference voltage (730). For example, monitoring circuit 432 (FIG. 4) further includes a second comparator (e.g., second comparator 510, FIG. 5A) that produces the predefined fault signal if a predefined electrical characteristic (e.g., capacitance, ESR, impedance, etc.) of a first subset of energy storage elements differs from the same predefined electrical characteristic of a second subset by more than the predefined amount. In an example, the predefined amount corresponds to threshold voltage $V_{th}$ 502, equal to 1.8 volts, which corresponds to the voltage produced by the first comparator 424 if the first and second subsets of energy storage elements differ in ESR by 2 ohms. Thus, for example, when the difference in ESR between the first and second subsets of energy storage elements is greater than 2 ohms, the output of the first comparator is greater than reference voltage 502 (e.g., $V_{out}$>1.8 volts, $V_{th}$=1.8 volts), and as a result second comparator 510 produces the predefined fault signal on its output.

Optionally, in response to production of the fault indicator output signal comprising the predefined fault signal, method 700 further includes performing (732) at least one action selected from the group consisting of: logging the fault indicator output signal (734); signaling a host system of an error event (736); and adjusting (e.g., reducing) an amount of data to be stored to non-volatile memory during a power fail operation (738). In some embodiments, one or more processors 202 (FIG. 4) are programmed to respond to the production of the fault indicator output signal by performing the at least one action. Furthermore, in some implementations, the fault indicator output signal is logged only if the predefined fault signal is produced. In some embodiments, if fault indicator output signal exceeds a threshold (e.g., $V_{out}=2$ volts), a write cache of the storage device (e.g., storage device 120, FIG. 1) is limited to a fraction of its capacity (e.g., 50%). In some embodiments, the write cache is turned off completely, and data transfer is limited to saving meta data.

In some embodiments, the one or more switches (e.g., transistors 311 and 312) include (740) a first switch coupling one or more of the first subset of the plurality of energy storage elements to the subsystem and a second switch coupling one or more of the second subset of the plurality of energy storage elements to the subsystem. Furthermore, in some embodiments, in accordance with a predefined fault determination, method 700 includes enabling (742) one of the first switch and second switch, and not enabling the other of the first switch and second switch (e.g., enabling transistor 311, and not enabling transistor 312). As an example, in FIG. 4, transistor 311 is enabled and transistor 312 is not enabled by one or more processors 202 if a fault has been detected in one or more energy storage elements of the energy storage bank 422 coupled to transistor 312, as a result of increased ESR in energy storage bank 312, for example.

In some embodiments, the fault indicator output signal is converted (744) from an analog signal to a digital signal. As noted above, in some embodiments the converting is performed by an analog to digital converter (ADC) (e.g., ADC 512, FIG. 5B). The ADC is optionally coupled to processor 202 through connections 330 and provides the converted digital signal. Alternatively, the ADC is an embedded component of processor 202.

In some embodiments, a phase of the AC test voltage is compared (746) with a phase of the fault indicator output signal, and a phase comparison signal is produced (748) corresponding to operability of the first subset of plurality of energy storage elements. In some embodiments, a phase comparator (e.g., phase comparator 516, FIG. 5D) compares a phase of the AC test voltage (e.g., Vcharge 306, FIG. 4) with a phase of the output of the first comparator (e.g., fault indicator output signal Vout 412, FIG. 4), and produces a phase comparison signal corresponding to the operability of the first and second subsets of energy storage element. As shown in FIGS. 6A-6C, fault indicator output signal Vout 412 will be shifted in phase relative to AC test voltage $V_{test}$ depending on whether changes in a predefined electrical characteristic (e.g., capacitance, ESR, impedance, etc.) are detected in energy storage bank 420 or 422.

Optionally, the one or more switches (e.g., transistors 311-312, FIG. 4) are enabled (750) to couple the plurality of energy storage elements to the subsystem through the one or more switches, in accordance with a determination that a power fail event has occurred. In some embodiments, a voltage corresponding to an external power supply voltage is compared (752) with a voltage corresponding to a predefined reference voltage. For example, processor 202 monitors voltages $V_{dd}$ 302 and $V_{SPD}$ 304. If either $V_{dd}$ 302 or $V_{SPD}$ 304 fall below predefined, corresponding under-voltage thresholds (or rise above corresponding over-voltage thresholds), processor 202 signals a power fail condition to a plurality of controllers on storage device 120 (e.g., storage controller 128 and NVM controllers 130, FIG. 1). In some embodiments, processor 202 controls transistors 310-312 such that processor 202 can control $V_{switched}$ 308 to be voltage from $V_{dd}$ 302 (e.g., during regular operation) or voltage from energy storage device 200 (e.g., during a power fail operation). For example, during regular operation of storage device 120, $V_{dd}$ 302 is used to supply power to storage device 120, so transistor 310 is turned on (e.g., to complete the connection between $V_{dd}$ 302 and $V_{switched}$ 308) and transistors 311 and 312 are turned off (e.g., to disable the connection between energy storage device 200 and $V_{switched}$ 308). However, during a power fail operation, energy storage device 200 is used to provide power to storage device 120, so transistor 310 is turned off (e.g., to disable the connection between $V_{dd}$ 302 and $V_{switched}$ 308), and both transistors 311 and 312 are turned on (e.g., to enable the connection between energy storage device 200 and $V_{switched}$ 308). Alternatively, during a power fail operation, transistor 310 is turned off, and only one of transistors 311 and 312 is turned on (e.g., to enable a connection between $V_{switched}$ 308 and the corresponding energy storage bank 420 or 422 in FIG. 4).

In some embodiments, with respect to any of the methods described above, the non-volatile memory is a single flash memory device, while in other embodiments, the non-volatile memory includes a plurality of flash memory devices.

In some embodiments, with respect to any of the methods described above, a memory device includes (1) an interface for coupling the memory device to a host system, (2) a plurality of controllers, each of the plurality of controllers configured to transfer data held in volatile memory to non-volatile memory, and (3) data hardening circuitry including one or more processors and an energy storage device, the memory device configured to perform or control performance of any of the methods described above.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive elements, active elements, or both. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, (e.g., a NOR memory array). One of skill in the art will recognize that the NAND and NOR memory configurations are exemplary, and memory elements may be otherwise configured.

The semiconductor memory elements included in a single device, such as memory elements located within and/or over the same substrate (e.g., a silicon substrate) or in a single die, may be distributed in a two- or three-dimensional manner (such as a two dimensional (2D) memory array structure or a three dimensional (3D) memory array structure).

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer on which the material layers of the memory elements are deposited and/or in which memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, including a bit line and a word line.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked planes of memory devices. The columns may be arranged in a two dimensional configuration (e.g., in an x-z plane), thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single plane, sometimes called a horizontal (e.g., x-z) plane for ease of discussion. Alternatively, the memory elements may be connected together to extend through multiple parallel planes. Other three dimensional configurations can be envisioned wherein some NAND strings contain memory elements in a single plane of memory elements (sometimes called a memory level) while other strings contain memory elements which extend through multiple parallel planes (sometimes called parallel memory levels). Three dimensional memory arrays may also be designed in a NOR configuration and in a ReRAM configuration.

A monolithic three dimensional memory array is one in which multiple planes of memory elements (also called multiple memory levels) are formed above and/or within a single substrate, such as a semiconductor wafer, according to a sequence of manufacturing operations. In a monolithic 3D memory array, the material layers forming a respective memory level, such as the topmost memory level, are located on top of the material layers forming an underlying memory level, but on the same single substrate. In some implementations, adjacent memory levels of a monolithic 3D memory array optionally share at least one material layer, while in other implementations adjacent memory levels have intervening material layers separating them.

In contrast, two dimensional memory arrays may be formed separately and then integrated together to form a non-monolithic 3D memory device in a hybrid manner. For example, stacked memories have been constructed by forming 2D memory levels on separate substrates and integrating the formed 2D memory levels atop each other. The substrate of each 2D memory level may be thinned or removed prior to integrating it into a 3D memory device. As the individual memory levels are formed on separate substrates, the resulting 3D memory arrays are not monolithic three dimensional memory arrays.

Associated circuitry is typically required for proper operation of the memory elements and for proper communication with the memory elements. This associated circuitry may be on the same substrate as the memory array and/or on a separate substrate. As non-limiting examples, the memory devices may have driver circuitry and control circuitry used in the programming and reading of the memory elements.

Further, more than one memory array selected from 2D memory arrays and 3D memory arrays (monolithic or hybrid) may be formed separately and then packaged together to form a stacked-chip memory device. A stacked-chip memory device includes multiple planes or layers of memory devices, sometimes called memory levels.

The term "three-dimensional memory device" (or 3D memory device) is herein defined to mean a memory device having multiple layers or multiple levels (e.g., sometimes called multiple memory levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

A person skilled in the art will recognize that the invention or inventions descried and claimed herein are not limited to the two dimensional and three dimensional exemplary structures described here, and instead cover all relevant memory structures suitable for implementing the invention or inventions as described herein and as understood by one skilled in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. An electronic device, comprising:
   a subsystem;
   a plurality of energy storage elements coupled to the subsystem through one or more switches;
   a charging and monitoring apparatus for concurrently charging the plurality of energy storage elements and monitoring operability of the plurality of energy storage elements, the charging and monitoring apparatus comprising:
      a bridge circuit comprising a plurality of resistive elements, the plurality of resistive elements including a measurement resistor coupled between a first node and a second node of the bridge circuit, wherein a first subset of the plurality of energy storage elements is coupled to the first node and a second subset of the plurality of energy storage elements, distinct from the first subset, is coupled to the second node;
      a power supply, coupled to the first node and the second node through the bridge circuit, for providing a direct current (DC) charging voltage and an alternating current (AC) test voltage to both the first subset of the plurality of energy storage elements and the second subset of the plurality of energy storage elements;
      a monitoring circuit coupled to the first node and second node and configured to produce a fault indicator output signal, the fault indicator output signal comprising a predefined fault signal if a predefined electrical characteristic of the first subset of the plurality of energy storage elements differs from a same predefined electrical characteristic of the second subset of the plurality of energy storage elements by more than a predefined amount.

2. The electronic device of claim 1, wherein the electronic device comprises a storage device having one or more non-volatile memory (NVM) devices.

3. The electronic device of claim 1, the plurality of energy storage elements comprises a plurality of capacitor banks, each capacitor bank comprising one or more capacitors.

4. The electronic device of claim 1, wherein the plurality of resistive elements in the bridge circuit includes an adjustable resistive element coupled between the power supply and the first node.

5. The electronic device of claim 1, the power supply providing the AC test voltage in accordance with a predefined duty cycle of less than 5 percent, and the monitoring circuit producing the output signal in accordance with the predefined duty cycle.

6. The electronic device of claim 1, wherein the AC test voltage comprises a sequence of positive pulses only.

7. The electronic device of claim 1, wherein:
   the monitoring circuit comprises a first comparator, and wherein the first comparator comprises a first input coupled to the first node, a second input coupled to the second node, and a first comparator output.

8. The electronic device of claim 7, the monitoring circuit further comprising a second comparator, wherein:
   the second comparator comprises a first input coupled to the output of the first comparator, a second input coupled to a reference voltage, and an output, and
   the second comparator is configured to produce the predefined fault signal on said output of the second comparator if the predefined electrical characteristic of the first subset of the plurality of energy storage elements differs from the same predefined electrical characteristic of the second subset of the plurality of energy storage elements by more than the predefined amount.

9. The electronic device of claim 7, the monitoring circuit further comprising an analog-to-digital converter (ADC), wherein the ADC comprises an input coupled to the first comparator output.

10. The electronic device of claim 7, the monitoring circuit further comprising a servo circuit coupled to the first comparator output and to at least two adjustable resistive elements in the bridge circuit, wherein:
    the servo circuit is configured to adjust at least one of the adjustable resistive elements in the bridge circuit until the first comparator output is minimized or satisfies by a predefined null condition.

11. The electronic device of claim 7, the monitoring circuit further comprising a phase comparator for:
    comparing a phase of the AC test voltage with a phase of the first comparator output, and
    producing a phase comparison signal corresponding to operability of the first subset of plurality of energy storage elements.

12. The electronic device of claim 1, further comprising a processor programmed to respond to production of the fault indicator output signal comprising the predefined fault signal by performing at least one action selected from the group consisting of:
    logging the fault indicator output signal; signaling a host system of an error event; and adjusting an amount of data to be stored to non-volatile memory during a power fail operation.

13. The electronic device of claim 1, further comprising:
    power fail logic for enabling the one or more switches to couple the plurality of energy storage elements to the subsystem through the one or more switches, in accordance with a determination that a power fail event has occurred.

14. The electronic device of claim 13, wherein the power fail logic includes at least one comparator for comparing a voltage corresponding to an external power supply voltage with a voltage corresponding to a predefined reference voltage.

15. The electronic device of claim 13, wherein
the one or more switches include a first switch coupling one or more of the first subset of the plurality of energy storage elements to the subsystem and a second switch coupling one or more of the second subset of the plurality of energy storage elements to the subsystem; and
the power fail logic includes logic for, in accordance with a predefined fault determination, enabling one of the first switch and second switch, and not enabling the other of the first switch and second switch.

16. A method of concurrently charging a plurality of energy storage elements and monitoring operability of the plurality of energy storage elements, wherein the plurality of energy storage elements are coupled to a subsystem through one or more switches, the method comprising:
providing a DC charging voltage and an AC test voltage to both a first subset of the plurality of energy storage elements and a second subset of the plurality of energy storage elements, distinct from the first subset; and
in response to providing the AC test voltage, producing a fault indicator output signal, wherein the fault indicator output signal comprises a predefined fault signal if a predefined electrical characteristic of the first subset of the plurality of energy storage elements differs from a same predefined electrical characteristic of the second subset of the plurality of energy storage elements by more than a predefined amount, wherein:
the first subset of the plurality of energy storage elements is coupled to a first node of a bridge circuit, and
the second subset of the plurality of energy storage elements is coupled to a second node of the bridge circuit, wherein the bridge circuit comprises a plurality of resistive elements, the plurality of resistive elements including a measurement resistor coupled between the first and the second node of the bridge circuit.

17. The method of claim 16, wherein the electronic device comprises a storage device having one or more non-volatile memory (NVM) devices.

18. The method of claim 16, wherein the plurality of energy storage elements comprise a plurality of capacitor banks, each capacitor bank comprising one or more capacitors.

19. The method of claim 16, wherein the plurality of resistive elements in the bridge circuit includes an adjustable resistive element, and the method includes adjusting the adjustable resistive element in the bridge circuit until a difference between a signal on the first node of the bridge circuit and a signal on the second node of the bridge circuit is minimized or satisfies by a predefined null condition.

20. The method of claim 16, wherein:
providing the AC test voltage is in accordance with a predefined duty cycle of less than 5 percent, and
producing the fault indicator output signal is in accordance with the predefined duty cycle.

21. The method of claim 16, wherein providing the AC test voltage comprises providing the AC test voltage as a sequence of positive pulses only.

22. The method of claim 16, further comprising:
comparing a predefined electrical characteristic of the first subset of the plurality of energy storage elements with a same predefined electrical characteristic of the second subset of the plurality of energy storage elements.

23. The method of claim 16, wherein the predefined amount corresponds to a reference voltage.

24. The method of claim 16, wherein the plurality of resistive elements in the bridge circuit includes at least two adjustable resistive elements and the method includes adjusting at least one of the adjustable resistive elements in the bridge circuit until a difference between a signal on the first node of the bridge circuit and a signal on the second node of the bridge circuit is minimized or satisfies by a predefined null condition.

* * * * *